United States Patent [19]

Williams

[11] Patent Number: 5,814,858
[45] Date of Patent: Sep. 29, 1998

[54] VERTICAL POWER MOSFET HAVING REDUCED SENSITIVITY TO VARIATIONS IN THICKNESS OF EPITAXIAL LAYER

[75] Inventor: Richard K. Williams, Cupertino, Calif.

[73] Assignee: Siliconix incorporated, Santa Clara, Calif.

[21] Appl. No.: 616,393

[22] Filed: Mar. 15, 1996

[51] Int. Cl.$^6$ ................................................. H01L 29/72
[52] U.S. Cl. .................... 257/328; 257/332; 257/341; 257/401; 257/549; 438/20; 438/40; 438/228
[58] Field of Search .................................. 257/328, 332, 257/341, 401, 549; 437/20, 40; 438/228

[56] References Cited

U.S. PATENT DOCUMENTS

| | | | |
|---|---|---|---|
| 5,045,900 | 9/1991 | Tamagawa | 257/502 |
| 5,282,018 | 1/1994 | Hiraki et al. | 257/296 |

*Primary Examiner*—Edward Wojciechowicz
*Attorney, Agent, or Firm*—Skjerven, Morrill, MacPherson, Franklin & Friel LLP; David E. Steuber

[57] ABSTRACT

A vertical power MOSFET, which could be a trench-gated or planar double-diffused device, includes an N+ substrate and an overlying N-epitaxial layer. An N-type buried layer is formed in the epitaxial layer and overlaps the substrate, the buried layer having a dopant concentration which is greater than the dopant concentration of the epitaxial layer but less than the dopant concentration of the substrate. The ion implant which is used to create the buried layer is preferably performed after most of the high temperature operations in the fabrication process in order to minimize the diffusion of the buried layer. This controls the distance between the top edge of the buried layer and the drain-body junction of the MOSFET and allows the breakdown voltage and on-resistance of the MOSFET to be determined substantially without regard to the thickness of the epitaxial layer.

25 Claims, 26 Drawing Sheets

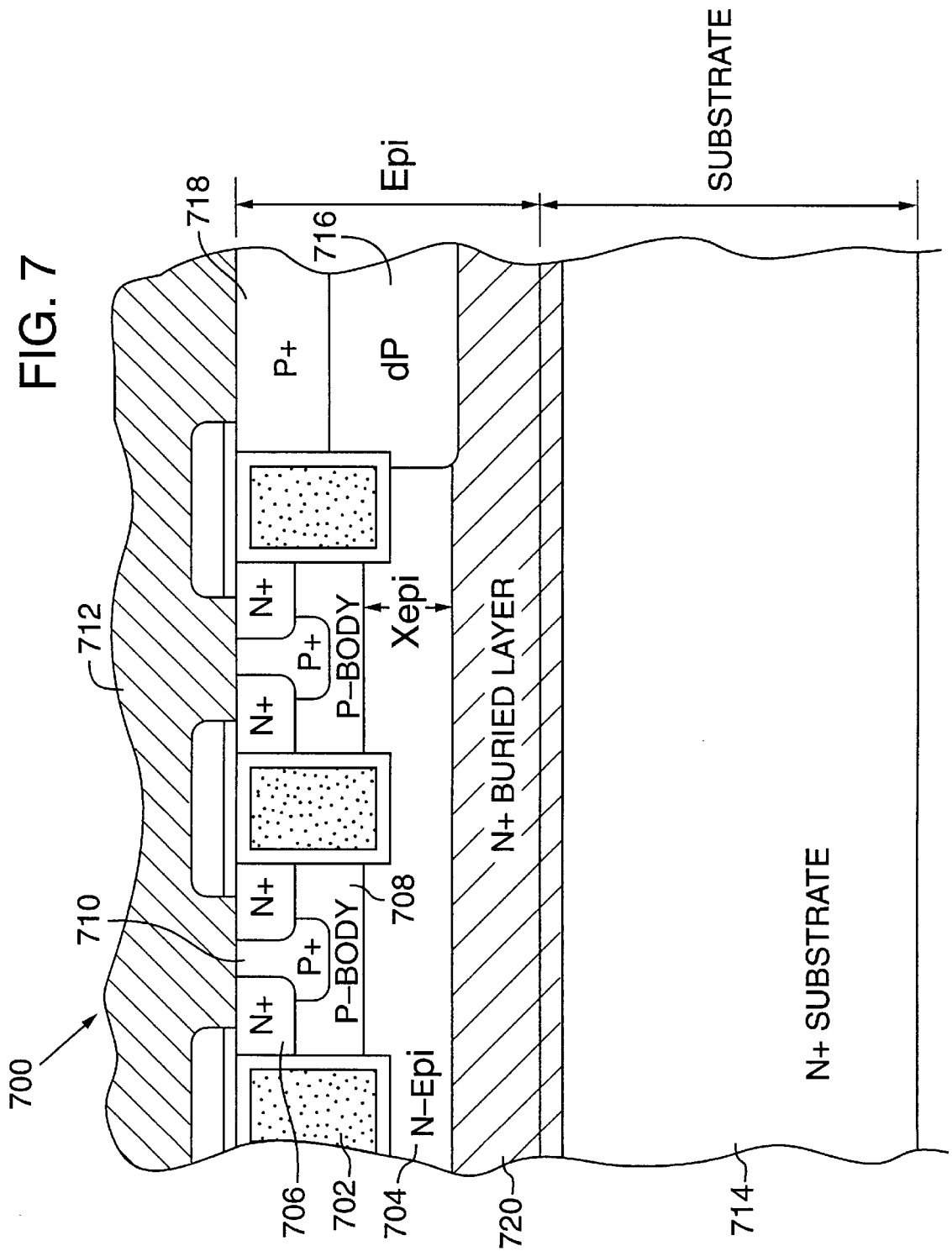

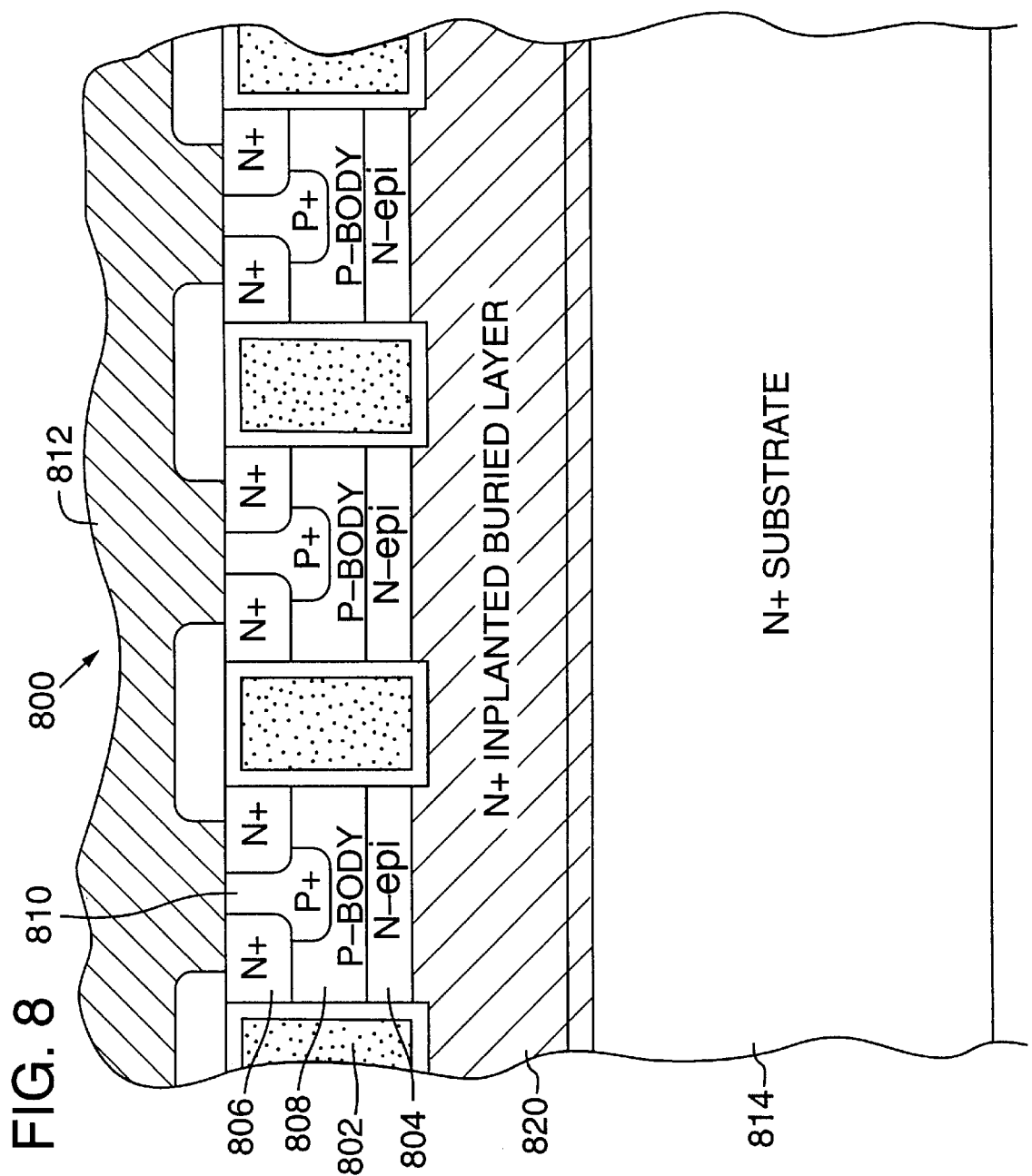

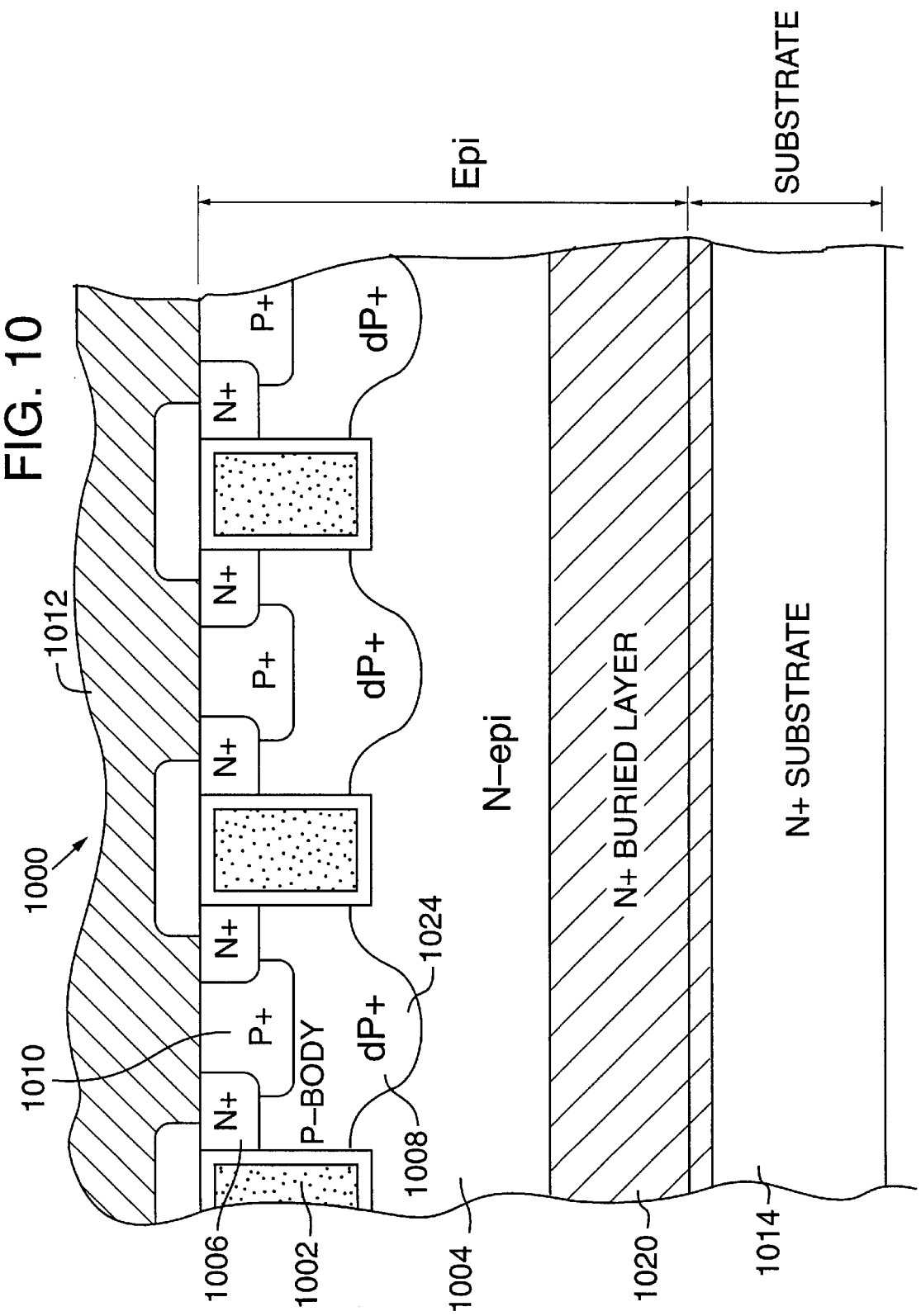

5,814,858

VERTICAL POWER MOSFET HAVING REDUCED SENSITIVITY TO VARIATIONS IN THICKNESS OF EPITAXIAL LAYER

FIELD OF THE INVENTION

This invention relates to vertical power MOSFETs and in particular to vertical power MOSFETs which are formed in a relatively thin epitaxial layer formed over a substrate.

BACKGROUND OF THE INVENTION

Two of the principal characteristics of a power MOSFET are its on-resistance, which is the resistance between its source and drain terminals when its gate is biased on, and its breakdown voltage, which is the voltage at which it experiences breakdown and conducts current when its gate is biased off. For vertical power MOSFETs which are formed in an epitaxial ("epi") layer, the dopant concentration and thickness of the epi layer have an effect on on-resistance and breakdown voltage. To the extent that the epi layer is made thicker and more lightly doped, the breakdown voltage increases, while the on-resistance also increases. Conversely, to the extent that the epi layer is made thinner and more heavily doped, both the on-resistance and breakdown voltage are reduced. In practice, a compromise is normally reached by making the epi layer as thin and as heavily doped as is permissible in light of the specified breakdown voltage of the device. The resulting on-resistance is accepted more or less as an inevitable consequence of the foregoing dichotomy.

Variations in the thickness of the epi layer thus alter the on-resistance and breakdown voltage of a vertical power MOSFET. These variations could occur during different production runs, among different wafers in a given run, or even in a single wafer. When the epi layer is relatively thick (e.g., in the range of 10 to 50 $\mu$m) such variations are normally not significant in percentage terms, and therefore they do not create serious problems. The situation changes, however, as the thickness of the epi layer is reduced, particularly in MOSFETs which are designed to operate at low voltages (e.g., below 60 V and especially below 15 V).

This problem is illustrated in FIGS. 1A–1C. FIG. 1A illustrates a graph of dopant concentration versus depth in a vertical trench-gated MOSFET. The trench gate is illustrated along the horizontal axis. The three curves $X_{epi1}$, $X_{epi2}$ and $X_{epi3}$ represent dopant profiles corresponding to three different epi layer thicknesses. Each of the curves shows a transition from a relatively low dopant concentration within the N-epi layer to a relatively high dopant concentration in the N+ substrate. Cross-sectional views of MOSFETs which correspond to $X_{epi1}$ and $X_{epi3}$ are shown in FIGS. 1B and 1C, respectively.

Assume that the bottom of the trench is 2 $\mu$m below the surface of the device and that $X_{epi1}$ is 3 $\mu$m below the surface, $X_{epi2}$ is 4 $\mu$m below the surface, and $X_{epi3}$ is 5 $\mu$m below the surface. Given these assumptions, one can easily see that variation of only ±1 $\mu$m in the thickness of the epi layer changes the distance between the bottom of the trench from 1 $\mu$m ($X_{epi1}$) to 3 $\mu$m ($X_{epi3}$). If $X_{epi3}$ represents the target epi layer thickness that is required to achieve a desired breakdown voltage, a device which ended up with $X_{epi1}$ would fall far short of the requirement. In this regime, the breakdown voltage would fall about 15–20 V for every 1 $\mu$m lost in epi thickness. One possible solution to this problem is to allow the trench to project entirely through the epi layer and into the substrate, as depicted in FIGS. 2A and 2B, which show a graph of dopant concentration versus depth and a cross-sectional view of the MOSFET, respectively. While this produces the lowest possible on-resistance and can minimize the effect of epi layer thickness variations, the integrity of the thermally grown gate oxide in the region where the trench projects into the substrate may be degraded as a result of crystallographic defects in the degenerately doped substrate. This may reduce the yield and reliability of the devices.

As shown in FIG. 3, a similar problem can occur in a low-voltage planar double-diffused MOSFET, where the distance between the bottom of the P-body and the substrate, designated Net $X_{epi}$, determines both the on-resistance and the breakdown voltage of the device. Because of variations in the thickness of the epi layer ($X_{epi}$), a certain percentage of the devices in a given production run may have unacceptably low breakdown voltages. Conversely, if the target epi layer thickness is increased to avoid this result, some of the devices may have unacceptably high on-resistances. Again, these problems are most prevalent in low-voltage devices, where the thickness of the epi layer must be reduced in order to minimize on-resistance.

FIG. 4A is a graph showing the actual breakdown voltage $BV_{actual}$ as a function of the target breakdown voltage $BV_{target}$ for three cases: where the epi layer is the correct thickness ($X_{epi}$), where it exceeds the correct thickness by 0.5 $\mu$m ($X_{epi}+3\sigma$) and where it is less than the correct thickness by 0.5 $\mu$m ($X_{epi}-3\sigma$). At relatively large values of $BV_{target}$, $BV_{actual}$ is essentially equal to $BV_{target}$ for all three cases, reflecting the fact that when the epi layer is relatively thick, variations in its thickness, either on the positive or negative side, do not appreciably affect the actual breakdown voltage. At lower levels of $BV_{target}$, however, $BV_{actual}$ falls significantly below $BV_{target}$ when the epi layer thickness is at the low side of the statistical range ($X_{epi}-3\sigma$). If the epi layer is equal to or greater than the correct thickness, $BV_{actual}$ is very close to $BV_{target}$ at all levels of $BV_{target}$. (In this case, the dominant factor in determining $BV_{actual}$ is the level of doping rather than the thickness of the epi layer.)

FIG. 4B is a graph of the on-resistance ($R_{DS}$) as a function of $BV_{target}$ for the same three cases that are shown in FIG. 4A. $R_{DS}$ does not vary appreciably with epi layer thickness at high levels of $BV_{target}$. At low levels of $BV_{target}$, $R_{DS}$ deviates significantly from the norm when the thickness of the epi layer is either greater than or less than the target thickness.

Thus, what is needed is a low-voltage vertical MOSFET in which the deviations in breakdown voltage and on-resistance caused by variations in the thickness of the epitaxial layer are minimized. Variations in the thickness of the epi layer are particularly difficult to control when the epi layer is thin, as in the case of optimized low-voltage power MOSFETs.

SUMMARY OF THE INVENTION

The vertical power MOSFET of this invention is formed in a substrate and an epitaxial layer overlying the substrate. The MOSFET includes a source region of a first conductivity type adjacent the top surface of the epitaxial layer, a body region of a second conductivity type opposite to the first conductivity type, and a drain region of the first conductivity type, the drain region comprising the substrate and a lower portion of the epitaxial layer. The dopant concentration in the substrate is greater than the dopant concentration in the drain portion of the epitaxial layer. In accordance with the invention, a buried layer of the first conductivity type is formed in the epitaxial layer, the buried layer having a dopant concentration which is greater than the dopant concentration of the epitaxial layer but, typically, less than the dopant concentration of the substrate. The top edge of the buried layer is a predetermined distance from the top surface of the epitaxial layer.

The vertical power MOSFET could be, for example, a vertical trench-gated device or a planar double-diffused device.

The preferred method of forming the buried layer is by a high-energy ion implant through the top surface of the epitaxial layer. The buried layer extends into the heavily doped substrate. The ion implant is preferably performed after most high temperature operations in the process sequence to minimize diffusion of the buried layer and thereby control to the maximum extent possible the distance between the top edge of the buried layer and the top surface of the epitaxial layer. This in turn controls the distance between the top edge of the buried layer and the drain-body junction and allows the breakdown voltage and on-resistance of the MOSFET to be determined substantially without regard to the thickness of the epitaxial layer. In other words, the breakdown voltage and on-resistance of the device exhibit minimal variation from wafer to wafer and lot to lot.

In one embodiment of a trench-gated MOSFET, the trench does not extend into the buried layer, but the buried layer overlaps and extends into the substrate. The breakdown voltage of the MOSFET may be set by a deep region of the second conductivity type which can be formed in every MOSFET cell as an extension of the body region, or at a selected periodicity throughout the array of cells. In either case, the location of breakdown is kept away from the trenched gate. In another embodiment a localized, more heavily doped region of the first conductivity type is formed in the epitaxial layer above the buried layer in a central region of the MOSFET cells. The localized, more heavily doped region sets the value of the breakdown voltage and maintains the breakdown away from the trench; and it helps to reduce the series resistance of the current path from the channel to the substrate. In yet another embodiment of a trench-gated MOSFET, the trench extends into the buried layer and the buried layer extends into the substrate.

In other embodiments of a trench-gated MOSFET, the trenches are formed close together such that an intervening body region between the trenches is fully depleted of carriers when the MOSFET is in an off condition. The depleted region may be either N- or P-type conductivity. The buried layer may lie entirely below the bottom of the trench, or the trench may extend into the buried layer.

In yet another embodiment the buried layer is formed prior to the growth of the epi layer, using a dopant species with a higher diffusivity than the dopant used to dope the substrate. While this approach does not yield a device having a uniform distance between the top edge of the buried layer and the surface of the epi layer, it forms a heavily-doped region into which the trench may safely extend without degrading the quality of the gate oxide.

BRIEF DESCRIPTION OF THE DRAWING

FIG. 7 shows a cross-sectional view of a vertical trench-gated MOSFET having a buried layer in accordance with the invention and a deep diffusion located in one of every N cells to prevent breakdown within the active MOSFET cells.

FIG. 8 shows a cross-sectional view of a vertical trench-gated MOSFET in which the trenches extend into a buried layer in accordance with the invention.

FIG. 10 shows a cross-sectional view of a vertical trench-gated MOSFET having a buried layer in accordance with the invention and a deep body diffusion at the center of each MOSFET cell.

DESCRIPTION OF THE INVENTION

Figure 1A:
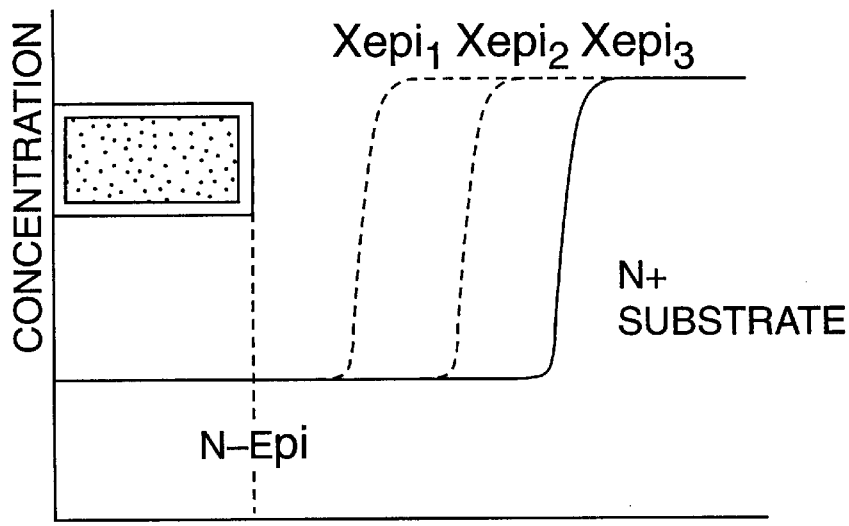
FIG. 1A shows a graph of the dopant concentration as a function of depth for three conventional trench-gated MOSFETs in which the trenches extend only into the epitaxial layer.
Figure 1B:
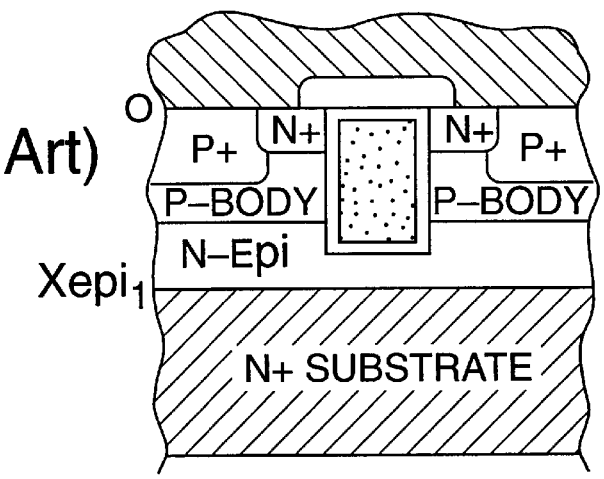
FIGS. 1B and 1C show cross-sectional views of two of the MOSFETs characterized in FIG. 1A.
Figure 1C:
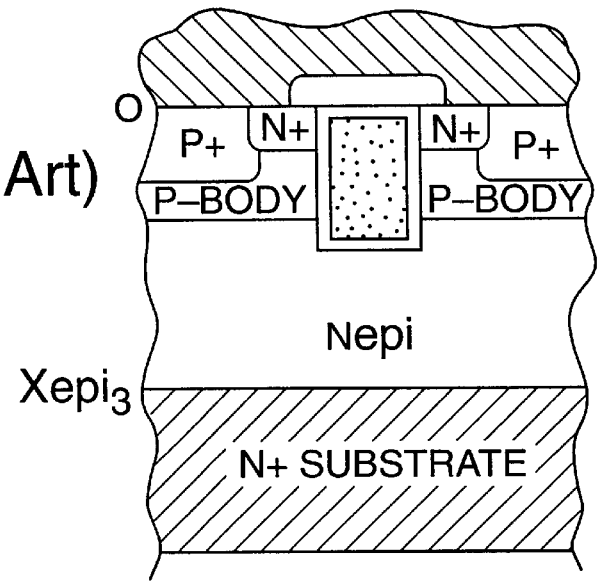
Figure 2A:
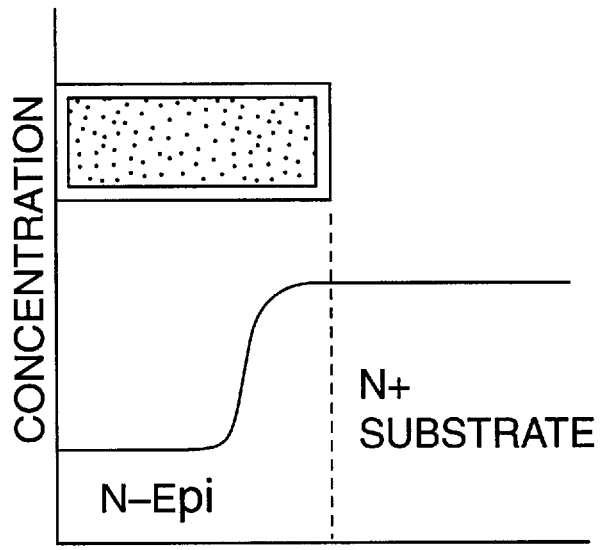
FIG. 2A shows a graph of the dopant concentration as a function of depth for a conventional trench-gated MOSFET in which the trench extends into the heavily-doped substrate.
Figure 2B:
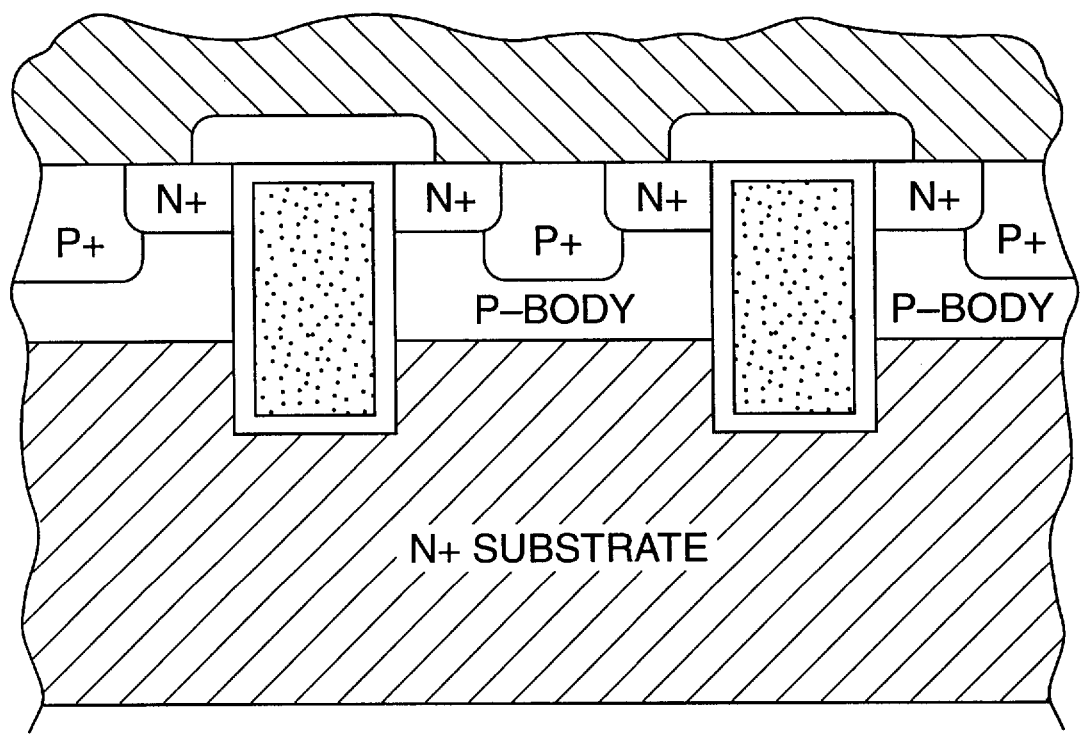
FIG. 2B shows a cross-sectional view of the MOSFET characterized in FIG. 2A.
Figure 3:
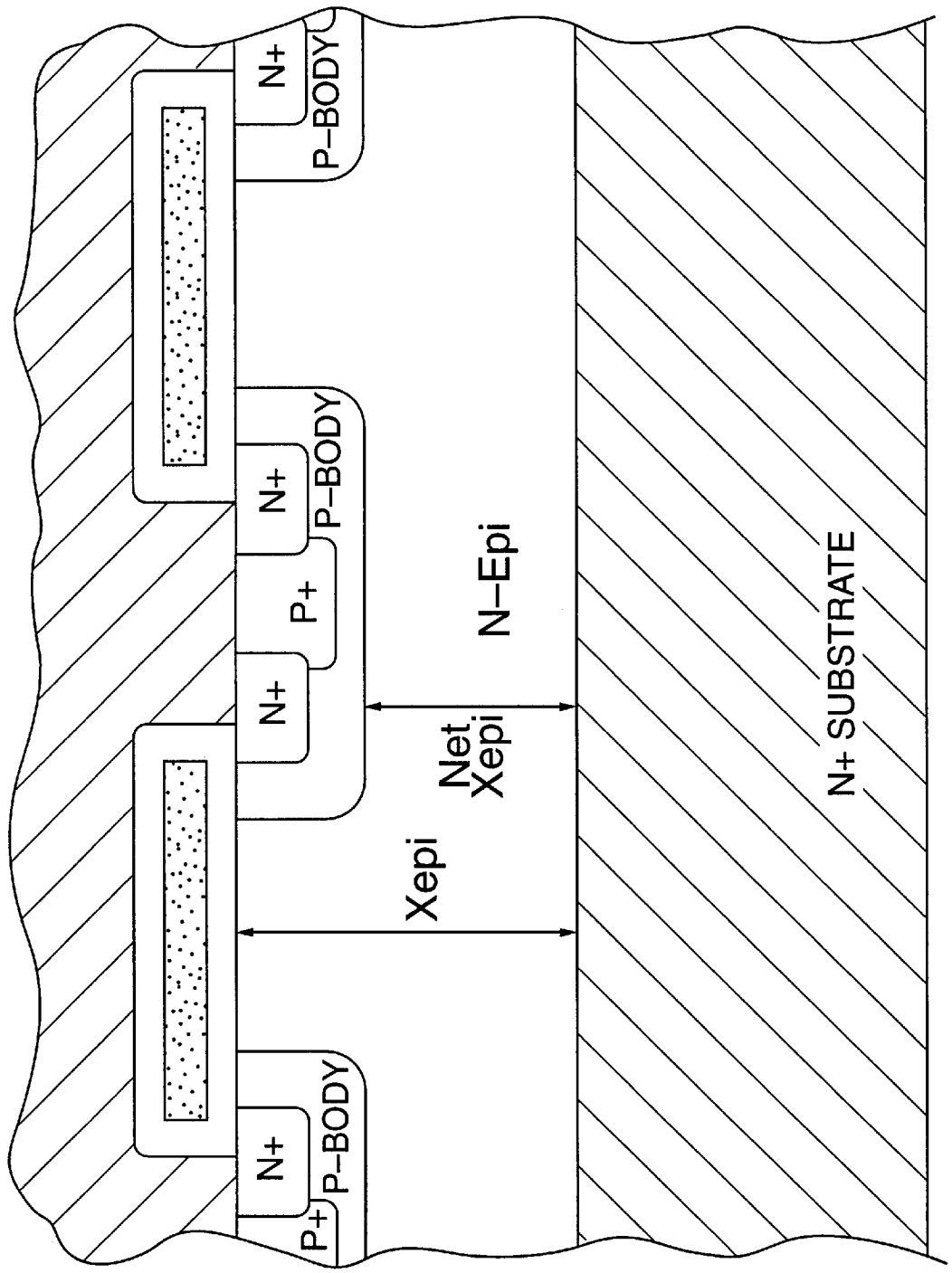
FIG. 3 shows a cross-sectional view of a conventional planar vertical double-diffused MOSFET.
Figure 4A:
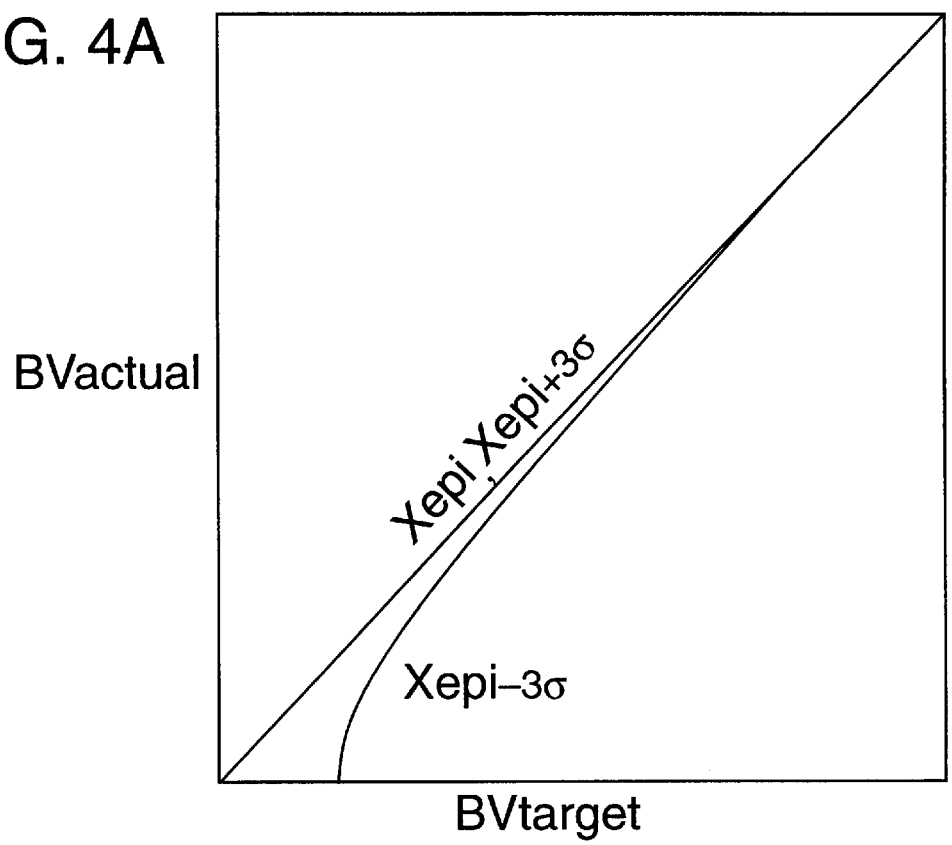
FIG. 4A illustrates a graph showing the actual breakdown voltage as a function of target breakdown voltage for MOSFETs having a range of epi thicknesses.
Figure 4B:
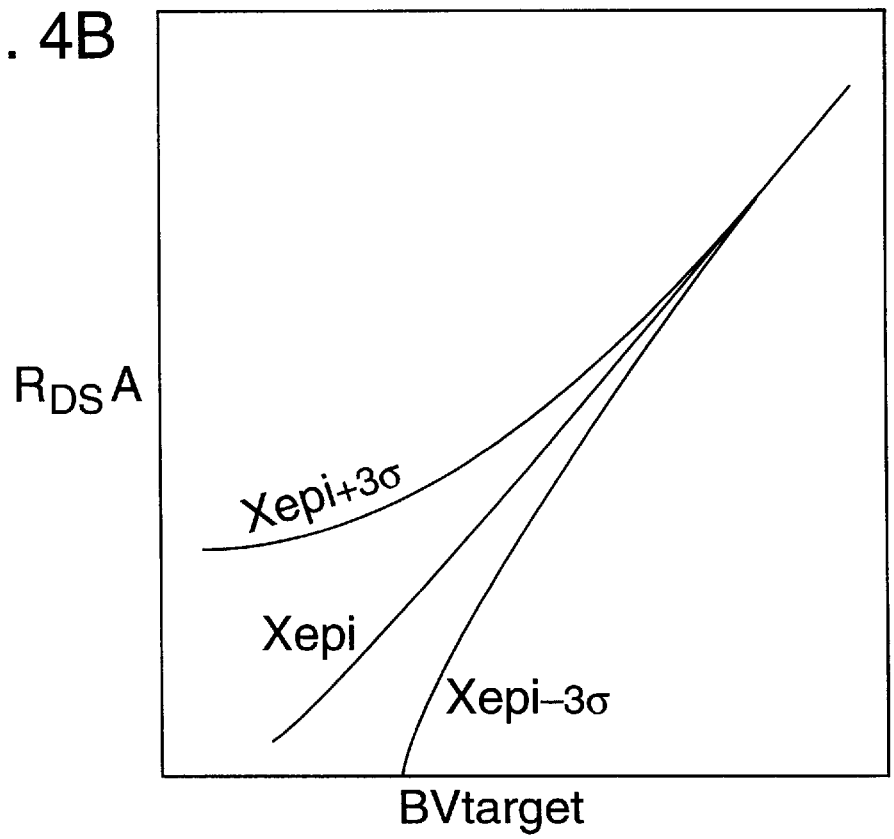
FIG. 4B illustrates a graph showing the on-resistance as a function of target breakdown voltage for MOSFETs having a range of epi thicknesses.
Figure 5A:
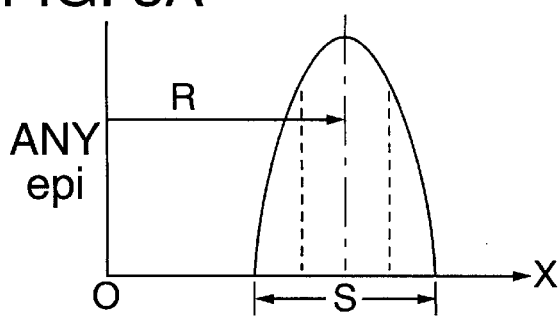
FIG. 5A shows a graph of dopant concentration as a function of depth for a buried layer implanted in an epi layer.
Figure 5B:
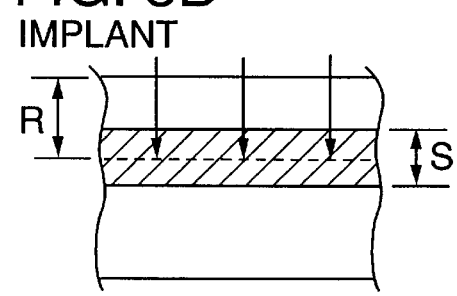
FIG. 5B shows a cross-sectional view of the buried layer characterized in FIG. 5A.

The buried layer of this invention is preferably formed by implanting dopant through the top surface of an epitaxial (epi) layer. FIGS. 5A–5H illustrate with graphs and cross-sectional views several possible locations of the buried layer. FIGS. 5A and 5B show the general case of a buried layer formed in any epi layer. Apart from the buried layer, the epi layer is assumed to be undoped. FIG. 5A shows the dopant concentration as a function of depth with R indicating the range of the implant and S indicating the straggle or deviation of the implant. These same perimeters are indicated in the cross-sectional view of FIG. 5B.

Figure 5C:
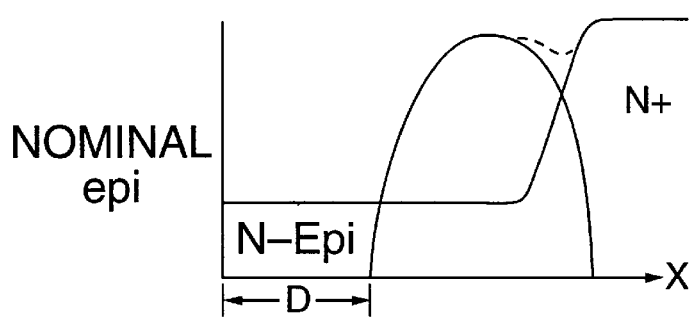
FIGS. 5C, 5E and 5G show graphs of dopant concentration as a function of depth for three buried layers implanted at different locations in relation to the interface between an epi layer and a substrate.
Figure 5D:
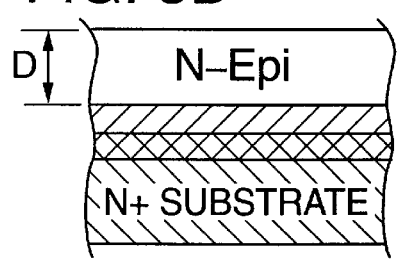
FIGS. 5D, 5F and 5H show cross-sectional views of the buried layers characterized in FIGS. 5C, 5E and 5G.
Figure 5E:
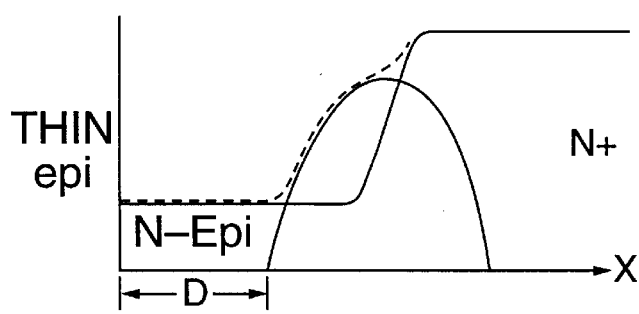
Figure 5F:
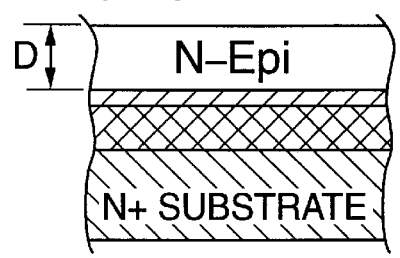
Figure 5G:
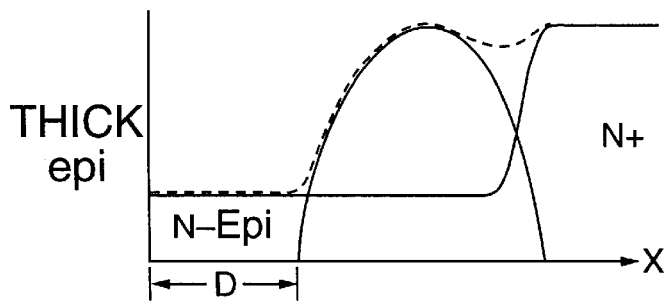
Figure 5H:
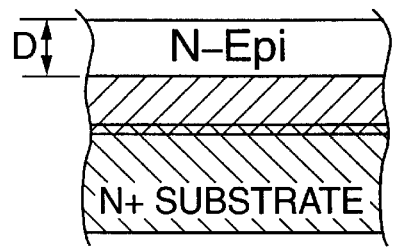

FIGS. 5C–5G illustrate three possible variations which may occur when a buried layer is implanted into a doped epi layer which is formed over a substrate. In FIGS. 5C and 5O, the peak concentration of the buried layer (the range of the implant) roughly coincides with the interface between the epi layer and the substrate. In FIGS. 5E and 5F, the peak concentration of the buried layer lies below the interface between the epi layer and substrate, and as a result most of the buried layer overlaps the substrate. In FIGS. 5G and 5H, the peak concentration of the buried layer lies above the interface between the epi layer and substrate, and as a result only a small portion of the buried layer overlaps the substrate. Note that in all three cases shown in FIGS. 5C–5H, the distance D between the top edge of the buried layer and the surface of the epi layer is approximately the same even though the thickness of the epi layer varies considerably.

Figure 6A:
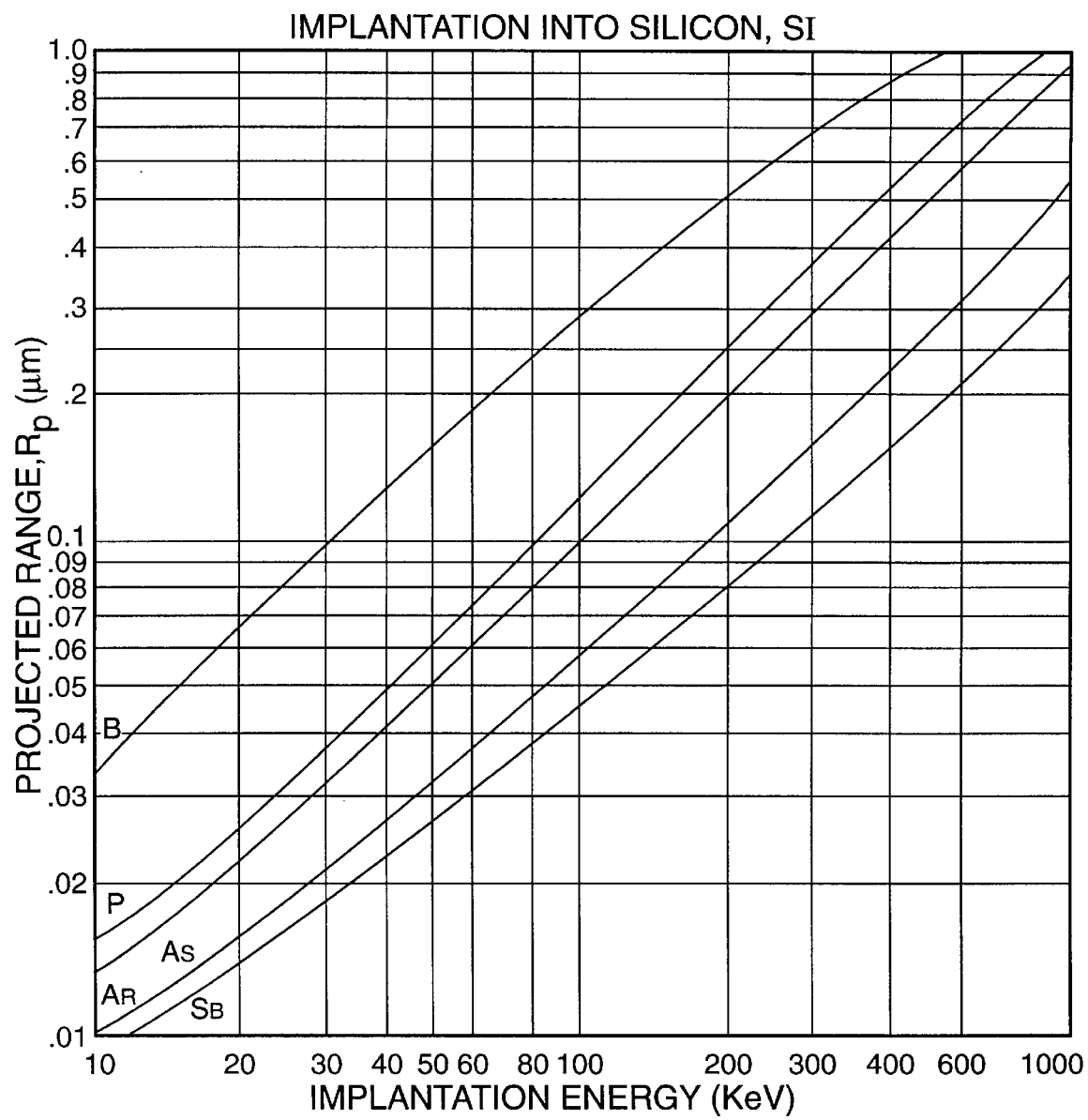
FIG. 6A is a graph which shows the projected range for the ion implantation into silicon of various dopants, including boron (B), phosphorus (P) and arsenic (Ar), as a function of implant energy. (Source: Semiconductor Technology Handbook, Technology Associates, 1980)
Figure 6B:
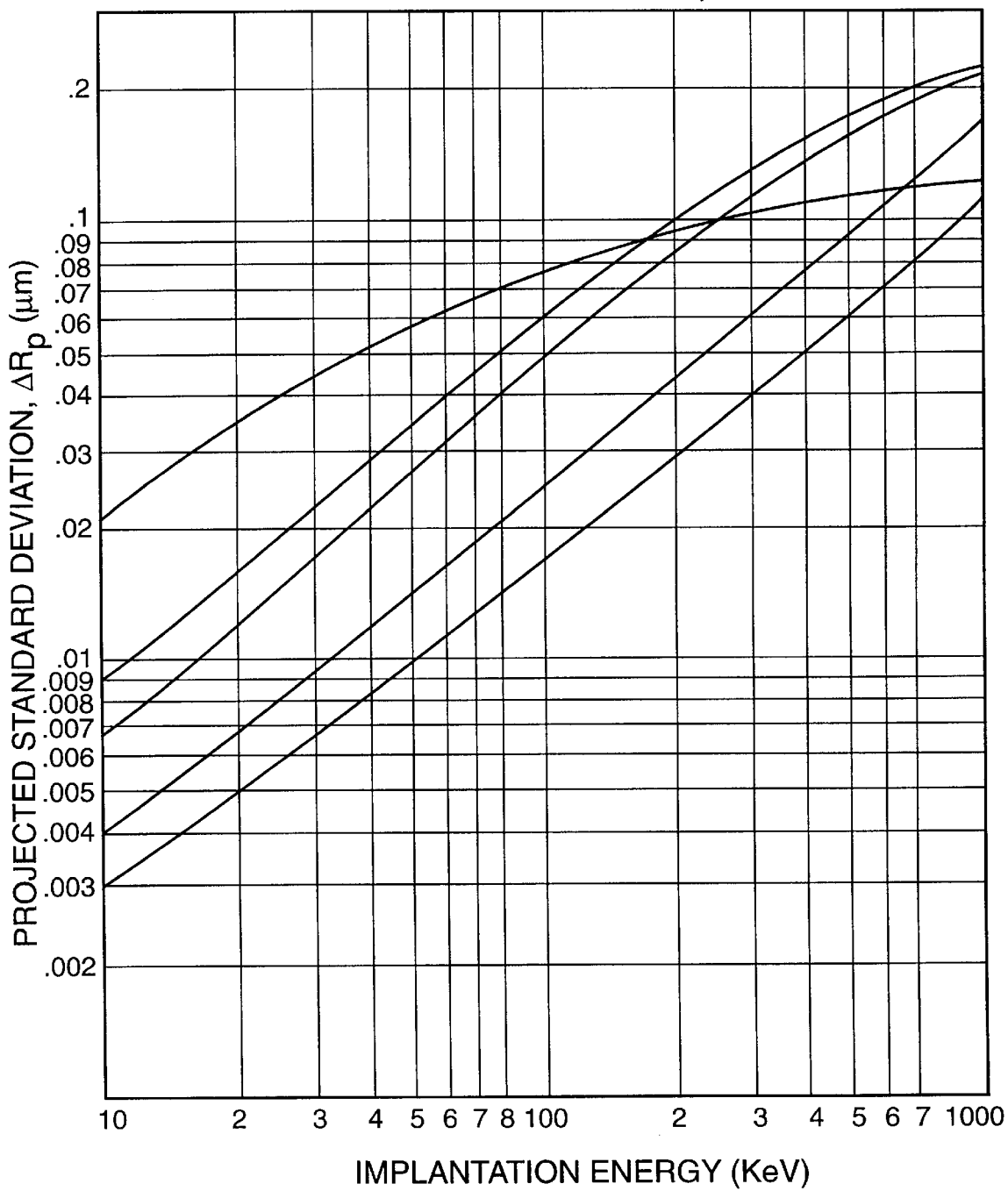
FIG. 6B is a graph which shows for silicon the straggle i.e. the variation in implant depth around the projected range, for the same dopants shown in FIG. 6A, as a function of implant energy. (Source: Semiconductor Technology Handbook, supra)
Figure 6C:
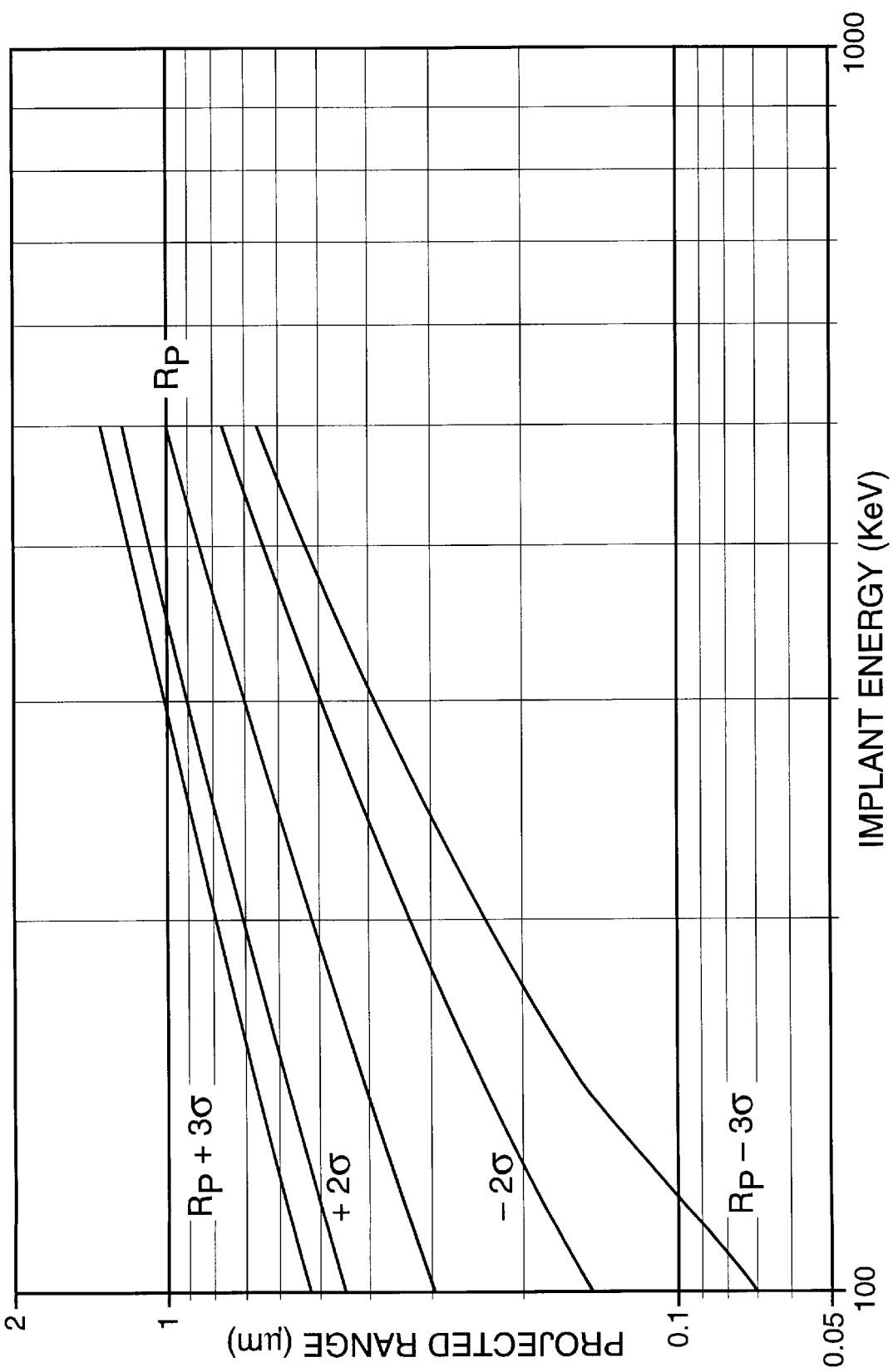
FIG. 6C is a graph which shows the range and vertical distribution of boron implanted into silicon as a function of implant energy.
Figure 6D:
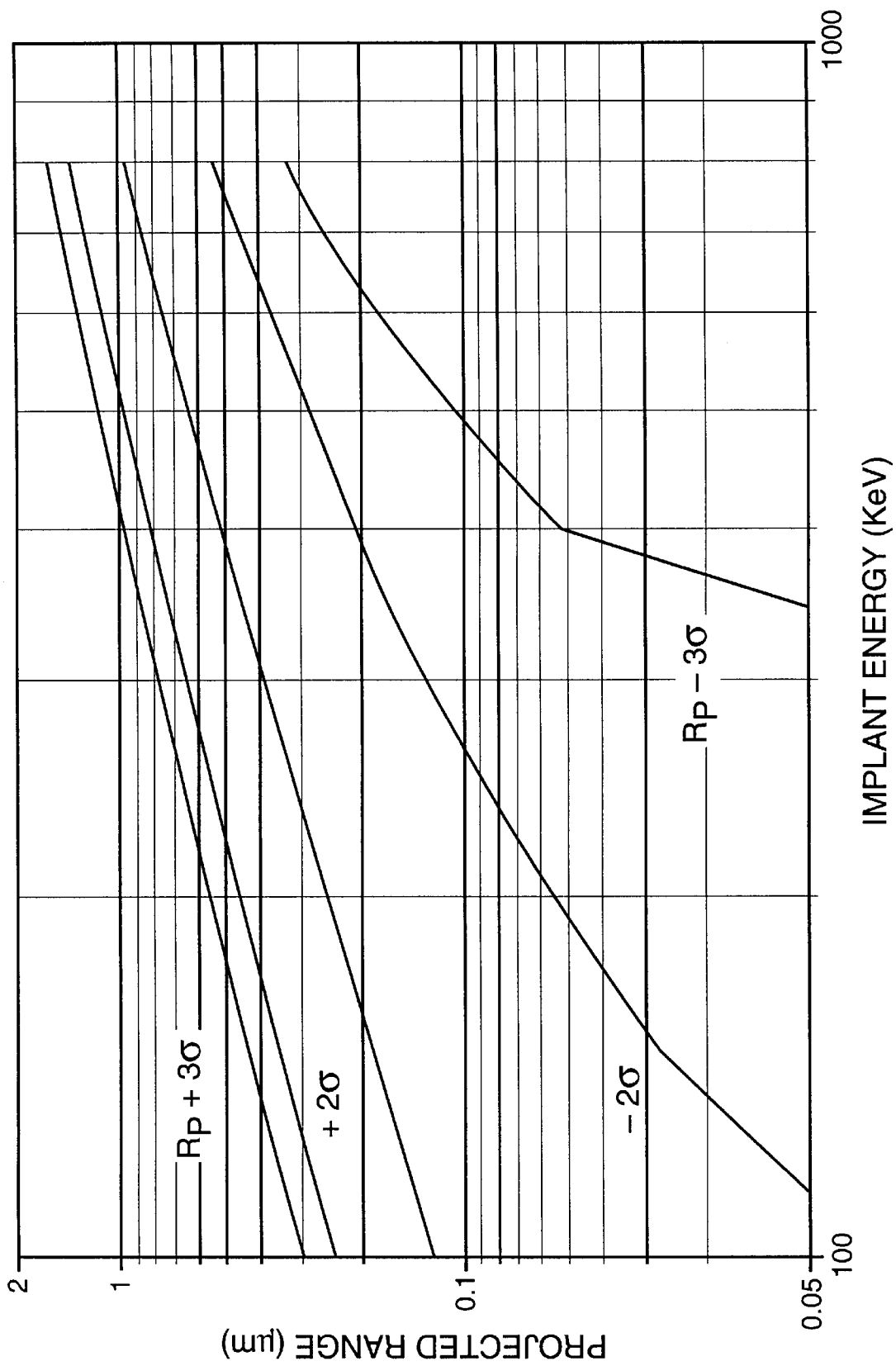
FIG. 6D is a graph which shows the range and vertical distribution of phosphorus implanted into silicon as a function of implant energy.

FIGS. 6A and 6B are graphs which show the projected range and straggle, respectively, of an ion implantation into silicon of boron (B), phosphorus (P), arsenic (As), antimony (Sb) and argon (Ar), as a function of implant energy. FIGS. 6C and 6D are graphs which show the typical deep and shallow statistical perturbations of boron and phosphorus implants, respectively, using the data of FIGS. 6A and 6B. $R_p$ represents the range. At the deep end of the implant, the projected range is $R_p+3\sigma$; at the shallow end of the implant the projected range is $R_p-3\sigma$.

FIG. 7 illustrates cross-sectional view of a trench-gated MOSFET 700 which includes a buried layer 720 in accordance with the principles of this invention. MOSFET 700 includes a trenched gate 702 which extends into an N-epi layer 704. Each cell of MOSFET 700 includes an N+ source 706 which extends around the perimeter of the cell adjacent the surface of epi layer 704. Below the N+ source region 706 is a P body region 708 which includes a channel region adjacent the wall of the trench. Adjacent the top surface of N-epi layer 704 at the center of the cell is a P+ contact region 710. A metal layer 712 makes contact with N+ source region 706 and P+ contact region 710 and shorts these two regions together. Note that in MOSFET 700 the bottom of P body region 708 is essentially flat and does not extend below the bottom of the trench.

N-epi layer 704 is formed on the surface of an N+ substrate 714. Within N-epi layer 704, outside the active MOSFET cells, a deep P region 716 is formed. Deep P region 716 is similar to the deep P region disclosed in application Ser. No. 08/459,555, filed Jun. 2, 1995, which is incorporated herein by reference. One deep P region (similar to deep P region 716) is formed for every N MOSFET cells, and each deep P region prevents breakdown from occurring in the active MOSFET cells. In this sense, deep P region 716 "protects" the MOSFET cells. Deep P region 716 includes a P+ contact region 718.

MOSFET 700 includes an N+ buried layer 720 in accordance with this invention. N+ buried layer 720 is formed primarily in the N-epi layer 704, but it also extends into the N+ substrate 714.

The breakdown voltage and on-resistance of MOSFET 700 are determined in part by the dopant concentration of N-epi layer 704 and the distance between the drain end of the channel and the top edge of N+ buried layer 720 (designated $X_{epi}$). $X_{epi}$ is in turn determined by the location of N+ buried layer 720 below the surface of the epi layer 704. N+ buried layer 720 is formed, as described below, by implanting N-type ions through the top surface of N-epi layer 704 at a selected energy and dosage. In this manner, the location of N+ buried layer 720 is determined, and thus the distance $X_{epi}$ is independent of the thickness of N-epi layer 704. Breakdown in MOSFET 700 would most likely occur at the location where deep P region 716 touches N+ buried layer 720.

FIG. 8 illustrates a cross-sectional view of a MOSFET 800 which includes a trenched gate 802, an N+ source region 806, and a P body region 808, which are generally similar to the corresponding regions of MOSFET 700. N+ buried layer 820 occupies a considerably larger percentage of a thinner epi layer than N+ buried layer 720, however, so that the trenches extend into N+ buried layer 820. The breakdown voltage of MOSFET 800 is determined by the distance between P+ contact region 810 and N+ buried layer 820 at the center of each MOSFET cell. Thus breakdown occurs at the center of each cell, and damage to the gate oxide from impact ionization near the corners of the trenches is prevented. The dopant concentration of N+ buried layer 820 is set at a lower level than that of N+ substrate 814. Doing so avoids crystal damage to the epi layer and resulting damage to the quality of the gate oxide where the trench extends into N+ buried layer 820.

Figure 9:
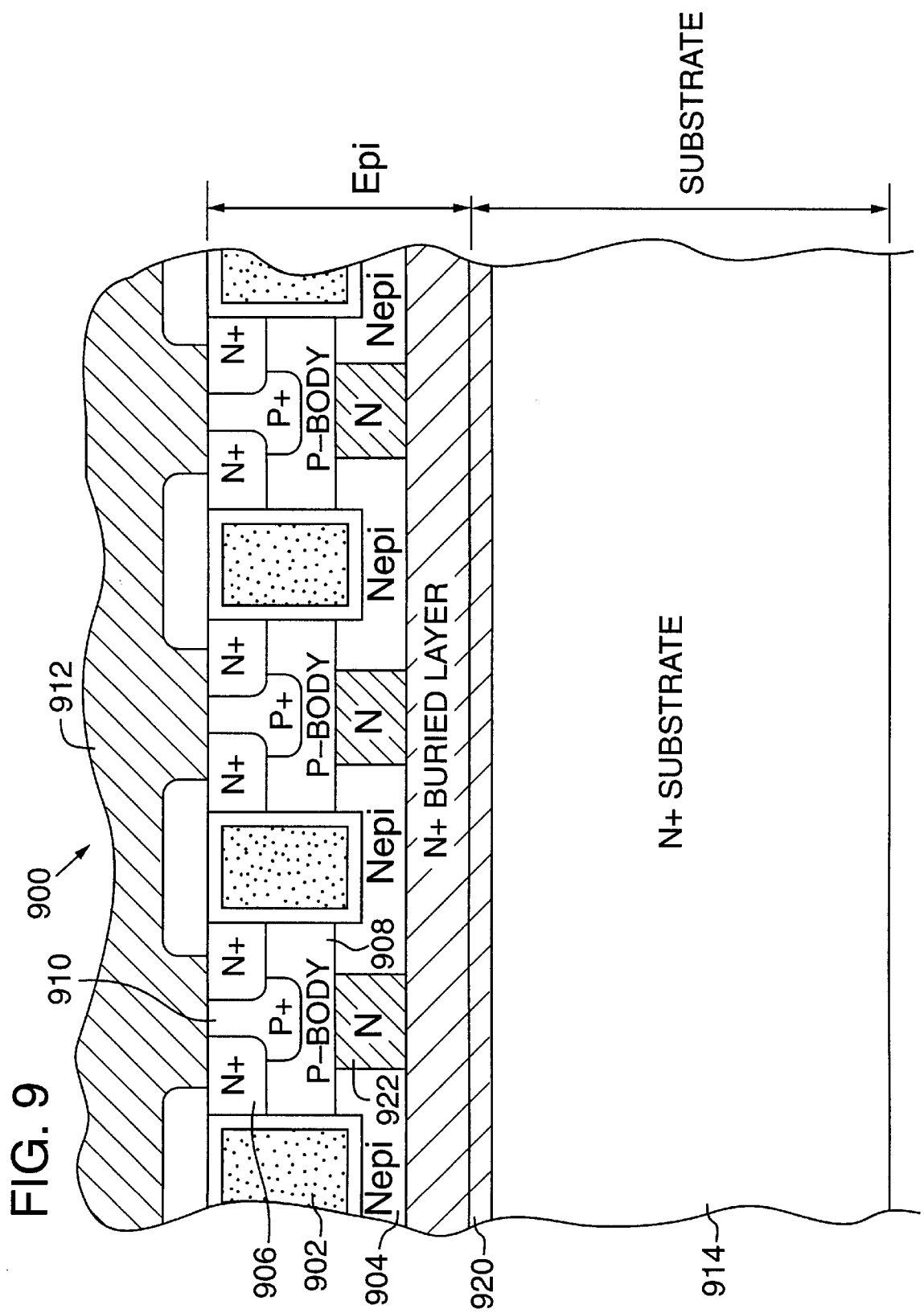
FIG. 9 shows a cross-sectional view of a vertical trench-gated MOSFET having a buried layer in accordance with the invention and having a plug of the same conductivity type as the buried layer at the center of each cell.

FIG. 9 illustrates a third embodiment which includes a MOSFET 900. MOSFET 900 is similar in basic structure to those previously described, but MOSFET 900 also includes an N-type dopant "plug" 922 which is formed in the center of each MOSFET cell. Dopant plug 922 extends to the N+ buried layer 920, which in turn extends into the N+ substrate 914. Accordingly, breakdown is forced to the center of each MOSFET cell, and is determined primarily by the vertical distance between P+ contact region 910 and N plug 922. The dopant concentration of N plug 922 would typically be in the range of $7 \times 10^{13}$ cm$^{-3}$ to $5 \times 10^{15}$ cm$^{-3}$. The resistance of the MOSFET is also lowered by this heavily doped plug.

FIG. 10 illustrates a cross-sectional view of a MOSFET 1000 in accordance with the invention. MOSFET 1000, which includes an N+ buried layer 1020, is generally similar in structure to the MOSFETs previously described, but it includes a deep P region 1024 at the center of each cell. Deep P region 1024 is similar to the deep P region taught in U.S. Pat. No. 5,072,266 to Bulucea et al., and it helps insure that breakdown will occur at the center of each MOSFET cell, away from the edge of the trench where it could cause damage to the gate oxide.

Figure 11A:
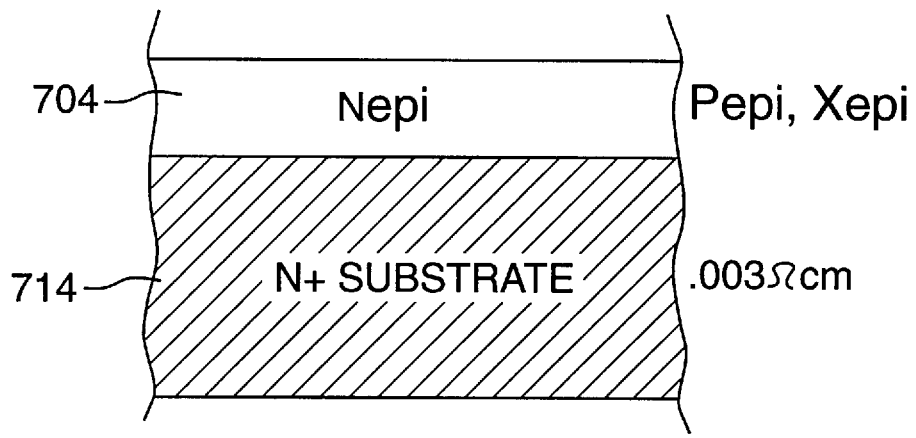
FIGS. 11A–11I illustrate the steps of a process for fabricating the MOSFET shown in FIG. 7.
Figure 11B:
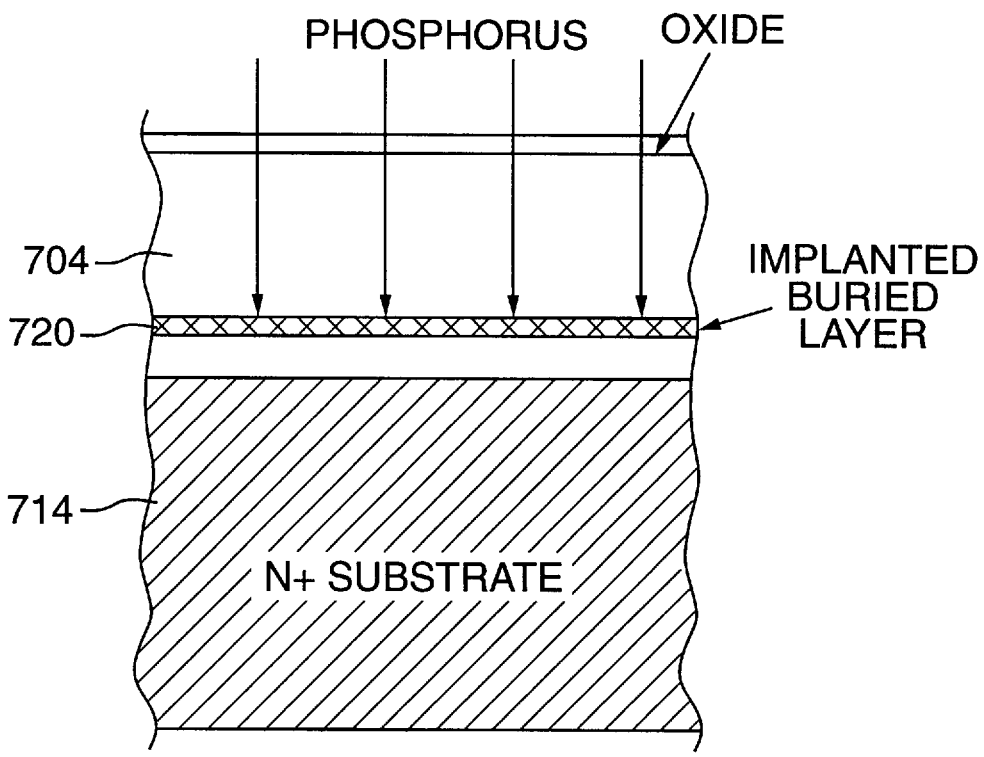

FIGS. 11A–11H illustrate a process sequence for forming the MOSFET 700 shown in FIG. 7. FIG. 11A shows N-epi layer 704 grown on the top surface of N+ substrate 714. N-epi layer 704 is typically in the range 1–6 μm thick and is doped to a concentration of $8 \times 10^{15}$ to $9 \times 10^{16}$ $cm^{-3}$. N+ substrate 714 is typically about 250–350 μm thick (after thinning) and has a resistivity of as low as 0.005 Ω-cm, and preferably as low as 0.003 Ω-cm or even 0.001 Ω-cm. At the time of fabrication N+ substrate 714 is frequently thicker, in the range of 450–550 μm. In FIG. 11B, a pre-implant oxide layer, typically several hundred angstroms thick, has been formed on the top surface of N-epi layer 704, and phosphorus ions are implanted into N-epi layer 704 to form N+ buried layer 720. Note that immediately after the implanting the buried layer 720 is located above the interface between N-epi layer 704 and N+ substrate 714.

To form an N-type buried layer, the phosphorus ions are implanted at an energy of about 800–900 KeV to obtain a range of about 1 μm. If a P-type buried layer were required (for a P-channel device), boron could be implanted at an energy of 500–600 KeV to obtain a 1 μm range.

Figure 11C:
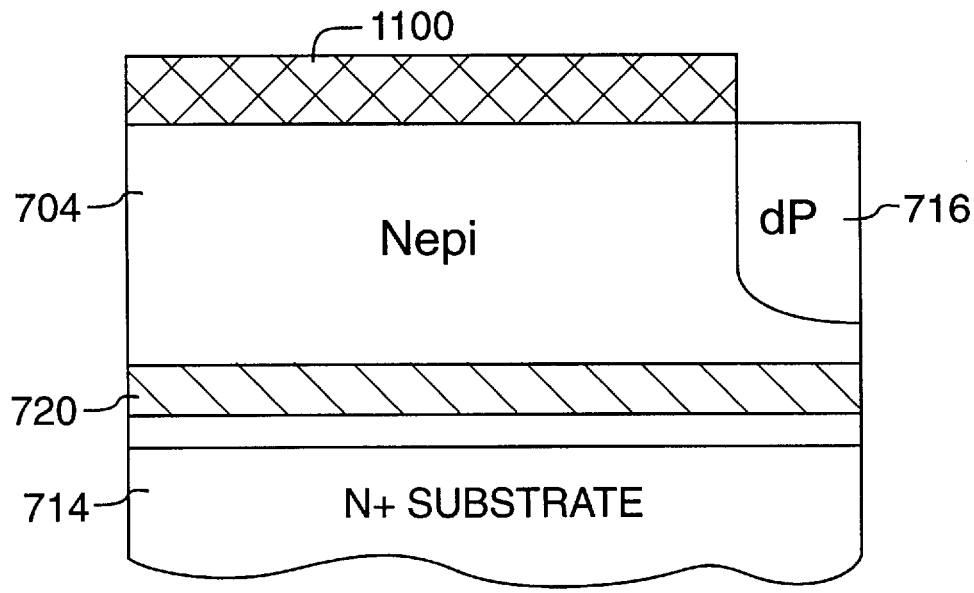

In FIG. 11C, a mask 1100 has been formed on the surface of N-epi layer 704, typically using an organic photoresist, and dopant is implanted through an opening in mask 1100 to form deep P region 716. Mask 1100 is then removed. Implant doses should be in the range of $1 \times 10^{14}$ $cm^{-2}$ to $8 \times 10^{15}$ $cm^{-2}$ and at energies ranging from 20 keV to 250 keV.

Figure 11D:
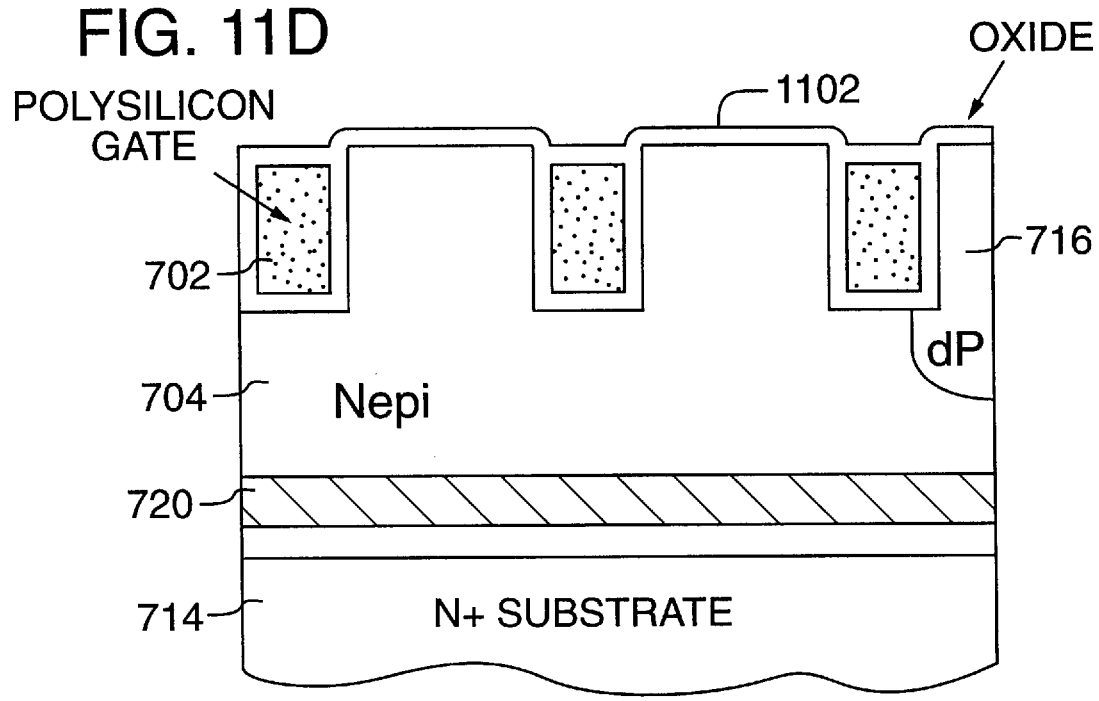

Trenches are then etched in the top surface of epi layer 704 (through an appropriate mask), a gate oxide layer is grown on the walls of the trenches, and the trenches are filled with polysilicon gate material, as shown in FIG. 11D. The polysilicon gate may be doped with ions of the same conductivity type as the epi layer, either during deposition in situ, before patterning using predeposition from $POCl_3$, or by ion implantation before or after patterning. An oxide layer 1102 is grown on the surface of epi layer 704 between the trenches.

Figure 11E:
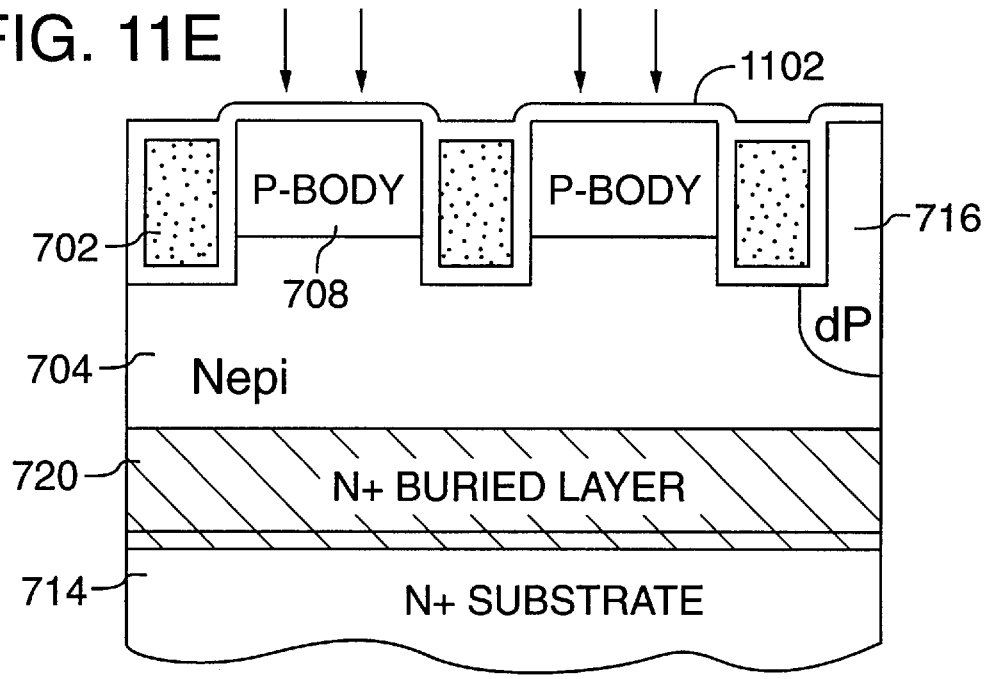

As shown in FIG. 11E, P body region 708 is formed by implantation through oxide layer 1102 and a subsequent drive-in. Ion implant doses are typically in the range of $1 \times 10^{13}$ $cm^{-2}$ to $1 \times 10^{14}$ $cm^{-2}$ at 30 keV to 150 keV. Diffusion temperatures range from 950° to 1150° C. for 1 to 10 hours with typical junction depths of 1–2 μm and with diffusivity-time products √Dt of 0.3 to 1.3 μm. Note that N+ buried layer 720 diffuses upward and downward during the drive-in step. Alternatively, the body could be formed prior to the trench.

Figure 11F:
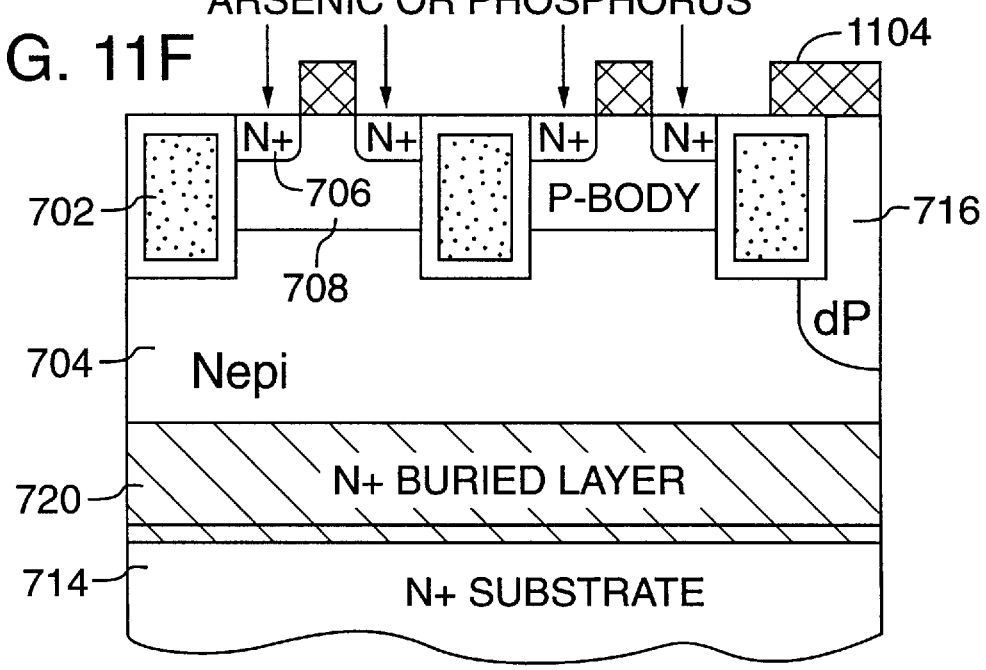
Figure 11G:
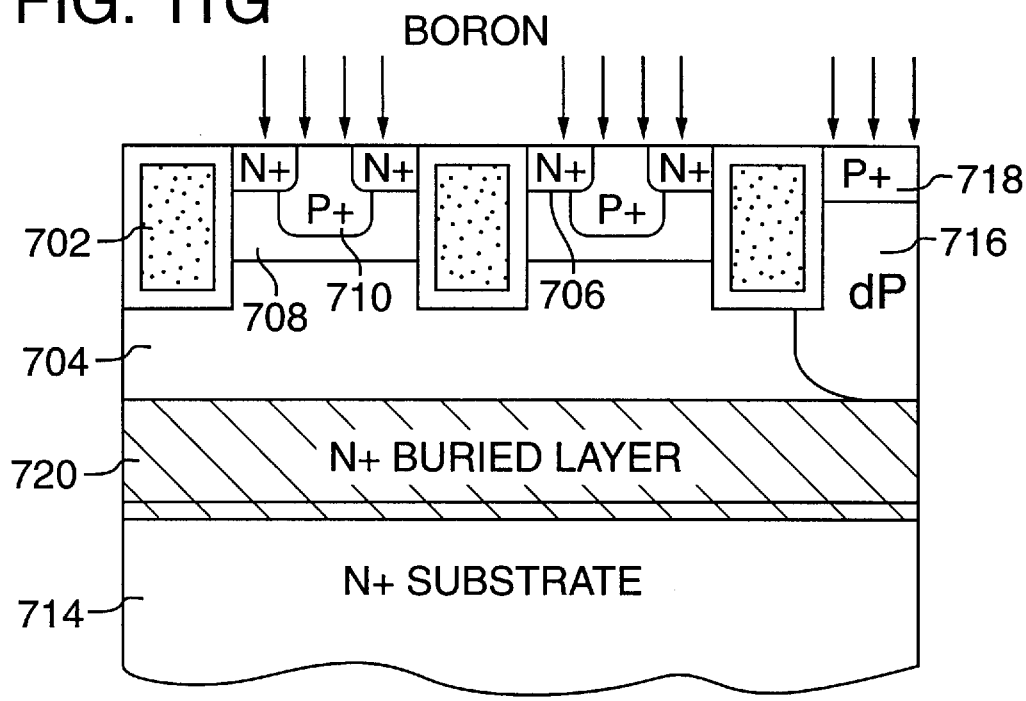

A mask 1104 is formed on the surface of N-epi layer 704, and N+ source regions 706 are formed by implantation and drive-in of arsenic or phosphorus ions (implant doses are typically in the range of $1 \times 10^{15}$ $cm^{-2}$ to $8 \times 10^{15}$ $cm^{-2}$ at 20 to 200 keV (but typically about 40 keV)). This step is illustrated in FIG. 11F. Next, P+ regions 710 and 718 are formed by implanting boron ions through the top surface of N-epi layer 704, as shown in FIGS. 11G (implant doses are typically in the range of $7 \times 10^{14}$ $cm^{-2}$ to $5 \times 10^{15}$ $cm^{-2}$ at 20 to 80 keV). This step may be performed with another mask or as a blanket implant so long as the P+ dopant does not counterdope the N+ regions and raise the sheet resistance or contact resistance of the N+ regions significantly. The subsequent drive-in step further expands N+ buried layer 720 until it touches the bottom of deep P region 716.

Figure 11H:
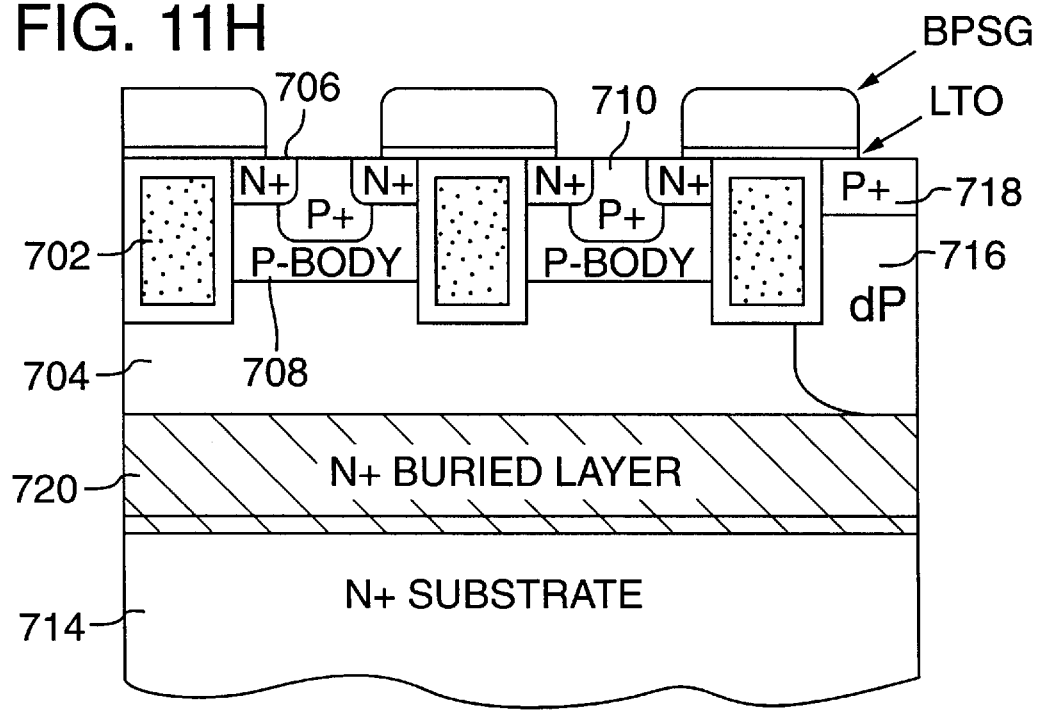
Figure 11I:
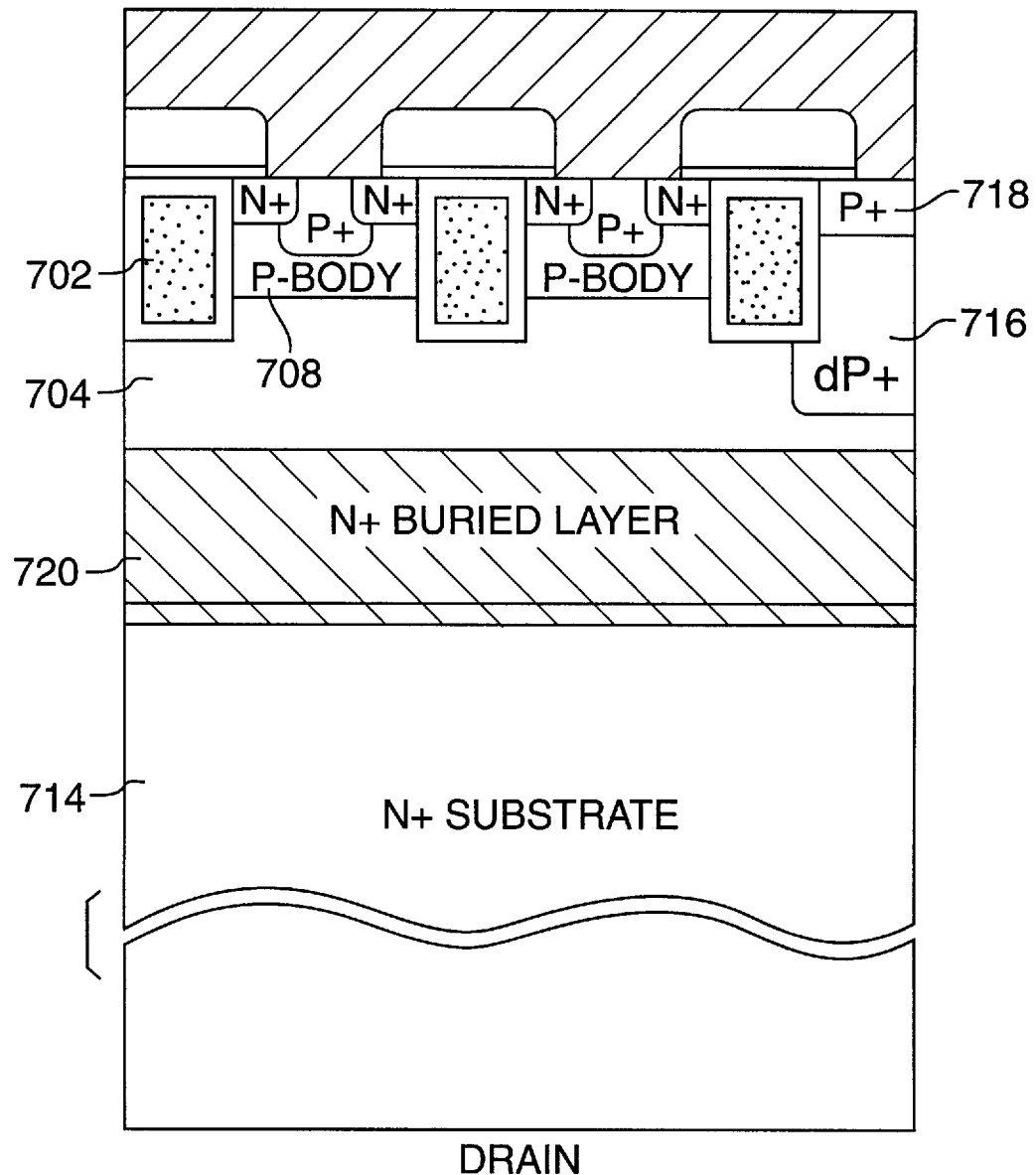

As shown in FIG. 11H, a low temperature oxide (LTO) layer 1106 and a borophosphosilicate glass (BPSG) layer 1108 are formed and patterned to cover the trenches. As shown in FIG. 11I, metal contact layer 712 is then formed to contact the source and body regions of MOSFET 700. A subsequent passivation deposition and masked etch may then be performed, using PSG or silicon nitride as the passivant.

Figure 11J:
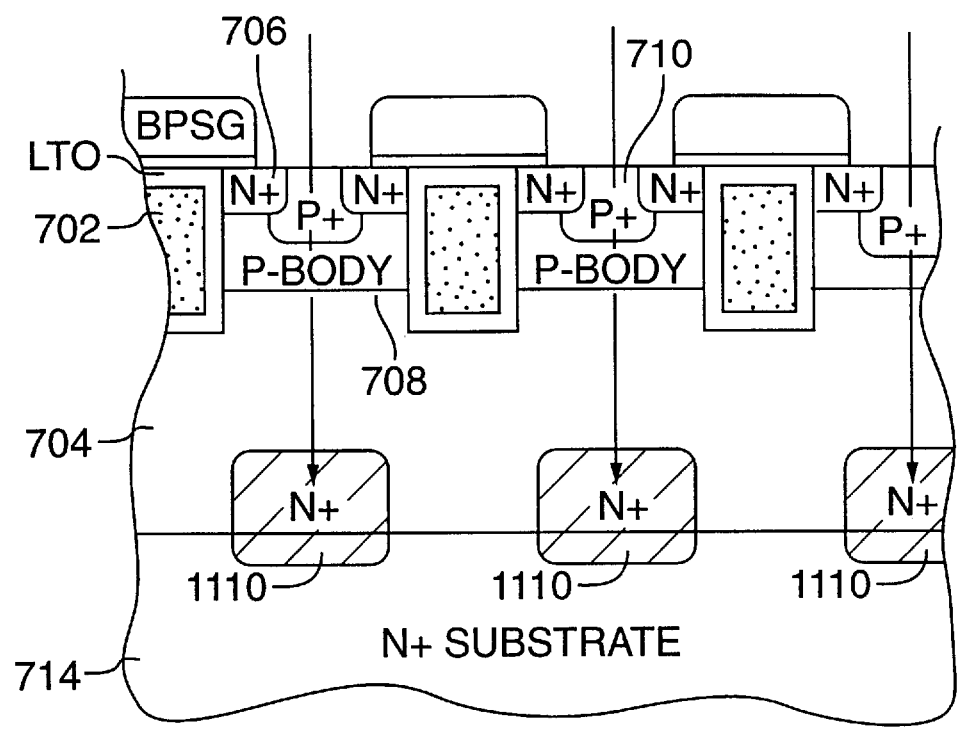
FIG. 11J illustrates a modification of the process shown in FIGS. 11A–11I.

In the process sequence shown in FIGS. 11A–11I, the N+ buried layer 720 is implanted after the N-epi layer is formed on the substrate. The buried layer could also be implanted at other stages of the process. For example, the buried layer could be implanted after P body region 708 is implanted and driven-in (FIG. 11E), in which case the buried layer would not experience the thermal effect of the body drive-in. The buried layer could also be implanted after the formation of the N+ source regions (FIG. 11F) or after the formation of the P+ regions (FIG. 11G). As shown in FIG. 11J, the N+ buried layer may even be implanted after the contact mask has been formed, in which case the buried layer is not continuous but instead consists of an array of discrete portions located under the centers of the MOSFET cells. Buried layer 1110 shown in FIG. 11J could be thermally activated and annealed to repair implant damage during the step of flowing the BPSG layer.

Figure 12:
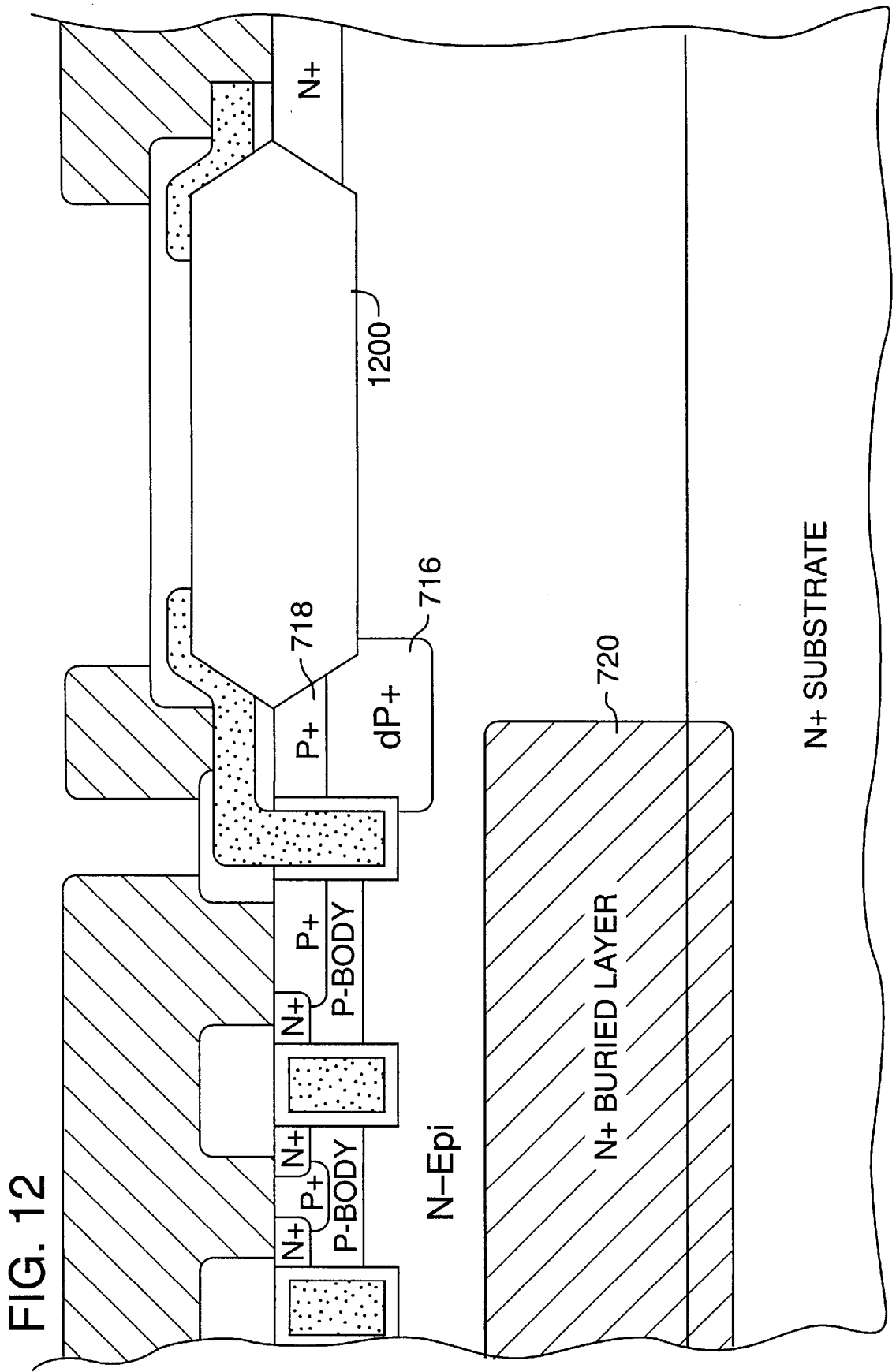
FIG. 12 shows a cross-sectional view of one possible termination area of the MOSFET shown in FIG. 7.

FIG. 12 shows a cross-sectional view of the termination area of a MOSFET, showing a field oxide region 1200 which prevents the implanted N+ buried layer 720 from extending into the termination region. Field oxide region 1200 could be formed, for example, immediately before the implanting of N+ layer 720 as shown in FIG. 11B. Alternatively, another type of mask could be used to prevent the N+ buried layer from extending into the termination region. By keeping the buried layer from the termination region, voltage breakdown is forced into the active MOSFET cells, which are capable of carrying large currents. The breakdown voltage is higher in the perimeter termination region, where the device is unable to handle a current density that is as high as in the MOSFET cells. In other instances, e.g. at low voltage, the buried layer can continue across the entire device.

Figure 13:
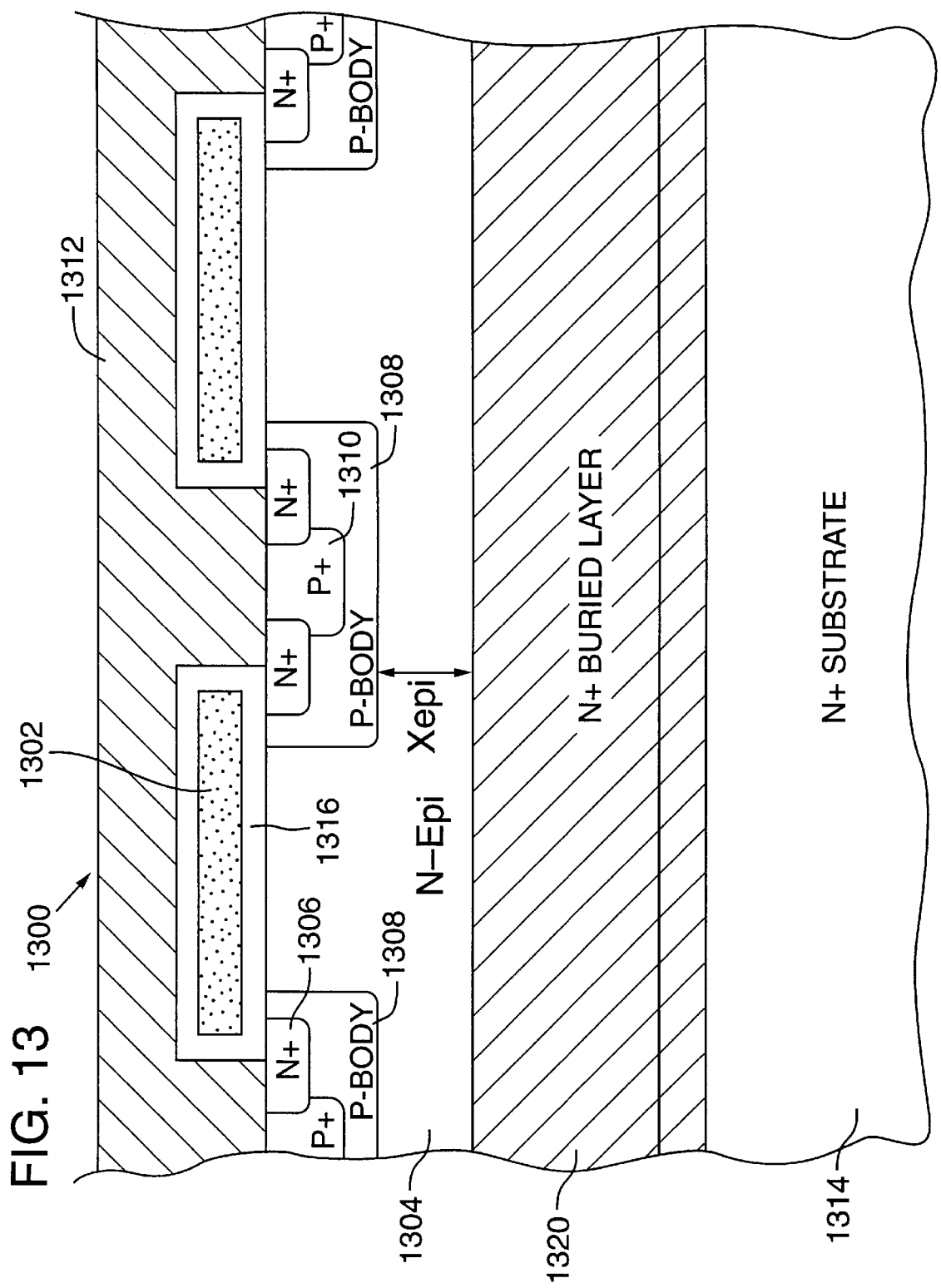
FIG. 13 shows a cross-sectional view of a vertical planar double-diffused MOSFET having a buried layer in accordance with the invention.

FIG. 13 is a cross-sectional view which illustrates the principles of this application applied to a planar double-diffused MOSFET (DMOS). MOSFET 1300 is formed in an N-epi layer 1304, which is grown on the surface of an N+ substrate 1314. N+ source regions 1306 and P body regions 1308 are formed in N-epi layer 1304. A metal contact layer 1312 makes contact with N+ source regions 1306 and, via P+ contact regions 1310, with P body region 1308. Since MOSFET 1300 is a vertical device, the drain includes the N+ substrate 1314 and N-epi region 1304. A gate 1302 is formed over channel regions within P body region 1308 and is separated from the surface of epi layer 1304 by a gate oxide layer 1316.

As is well known, when MOSFET 1300 is turned on, an electron current flows from N+ source regions 1306, laterally through P body region 1308, and then downward through N-epi layer 1304 and N+ substrate 1314.

In accordance with the invention, an N+ buried layer 1320 is formed within N-epi layer 1304 and extending into N+ substrate 1314. Since N+ buried layer 1320 is formed by implanting ions at a selected energy and dosage, the distance $X_{epi}$ between the upper edge of N+ buried layer 1320 and the bottom of P body region 1308 is maintained relatively constant. In particular, $X_{epi}$ is not affected by the thickness of N-epi layer 1304. As with the trench-gated MOSFET described above, this allows the breakdown voltage and on-resistance of the device to be set with greater precision and without concern that these parameters will be affected by the thickness of the epi layer.

Figure 14A:
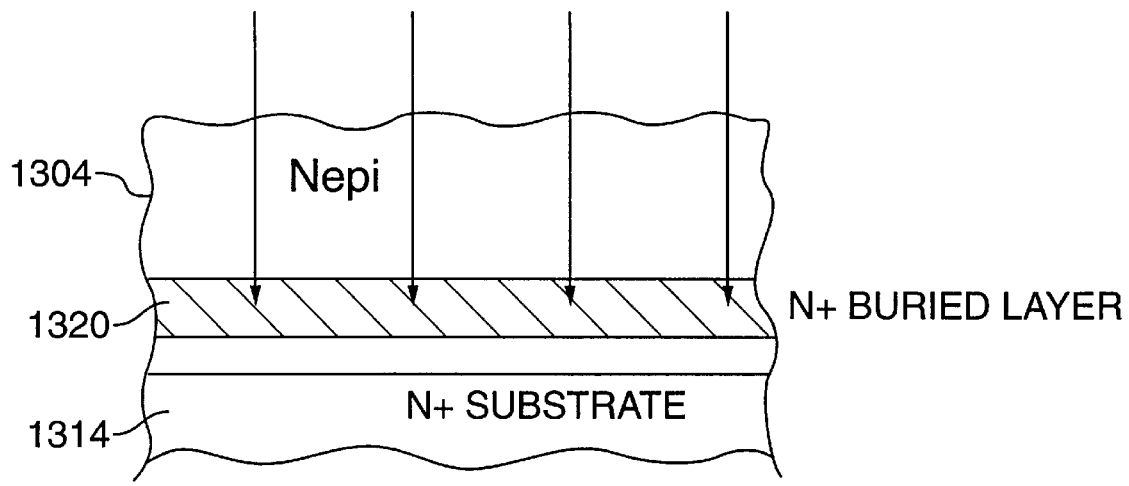
FIGS. 14A–14C illustrate the steps of a process for fabricating the MOSFET shown in FIG. 13.
Figure 14B:
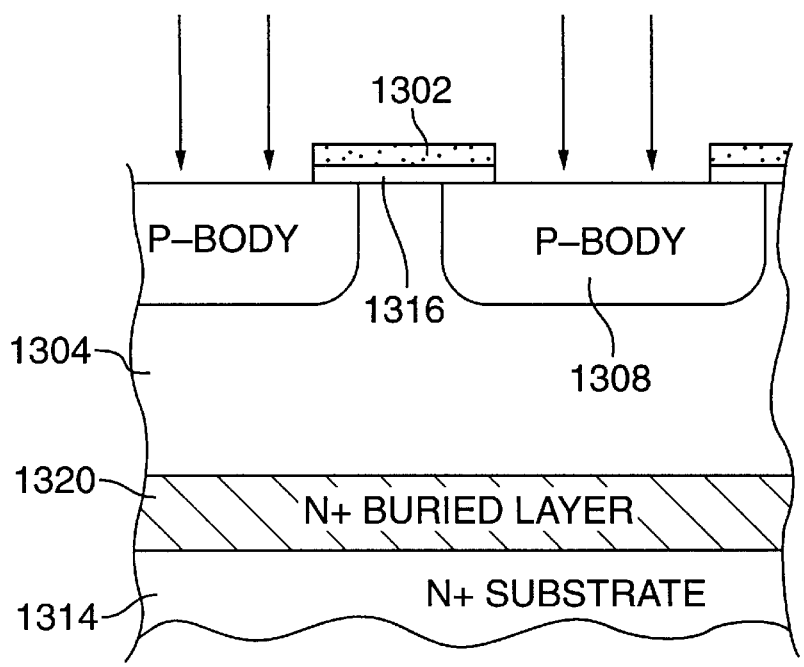
Figure 14C:
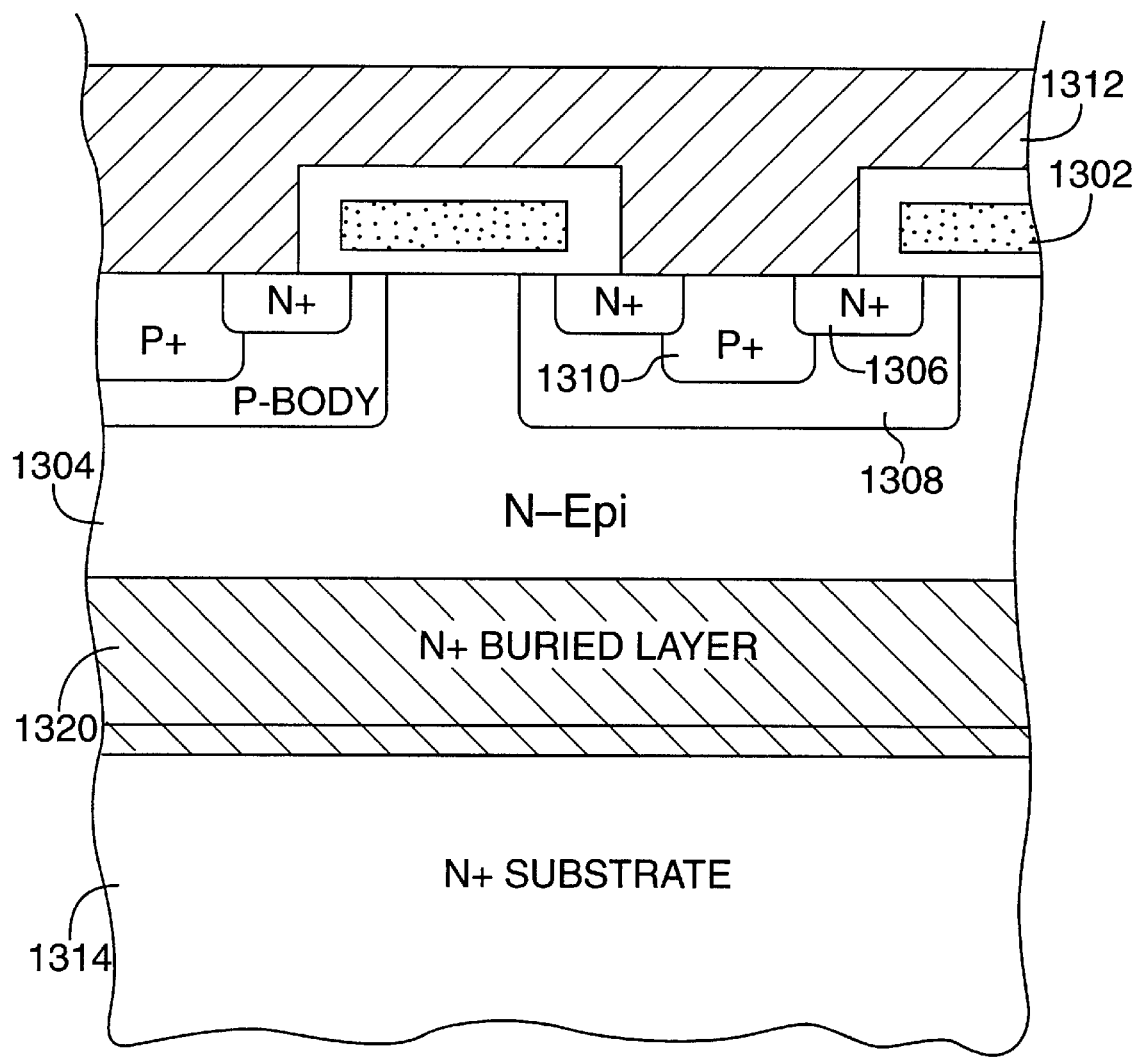

FIGS. 14A–14C illustrate several steps of a process sequence for fabricating MOSFET 1300. The doping concentrations, implant doses and energies, junction depths, and methods used to form the epi-layer, body diffusion, P+ body contact diffusion and N+ source diffusion of the planar DMOS are similar to the same steps used in the fabrication of the trench DMOS.

FIG. 14A shows N-epi layer 1304 grown on N+ substrate 1314 and N+ buried layer 1320 being implanted through the top surface of N-epi layer 1304.

In FIG. 14B, gate 1302 and gate oxide layer 1316 has been formed by known means, and P body region 1308 is implanted through the exposed top surface of N-epi layer 1304, with the gate 1302 acting as a mask. P body region 1308 is then driven-in, and this step causes N+ buried layer 1320 to diffuse upward and downward.

In FIG. 14C, N+ source regions 1306 and P+ contact regions 1310 have been implanted by known means, and metal layer 1312 has been formed to establish contact to the source and body of MOSFET 1300. N+ buried layer 1320 diffuses further as the N+ and P+ regions are driven-in, and as shown in FIG. 14C extends into N+ substrate 1314.

Figure 15A:
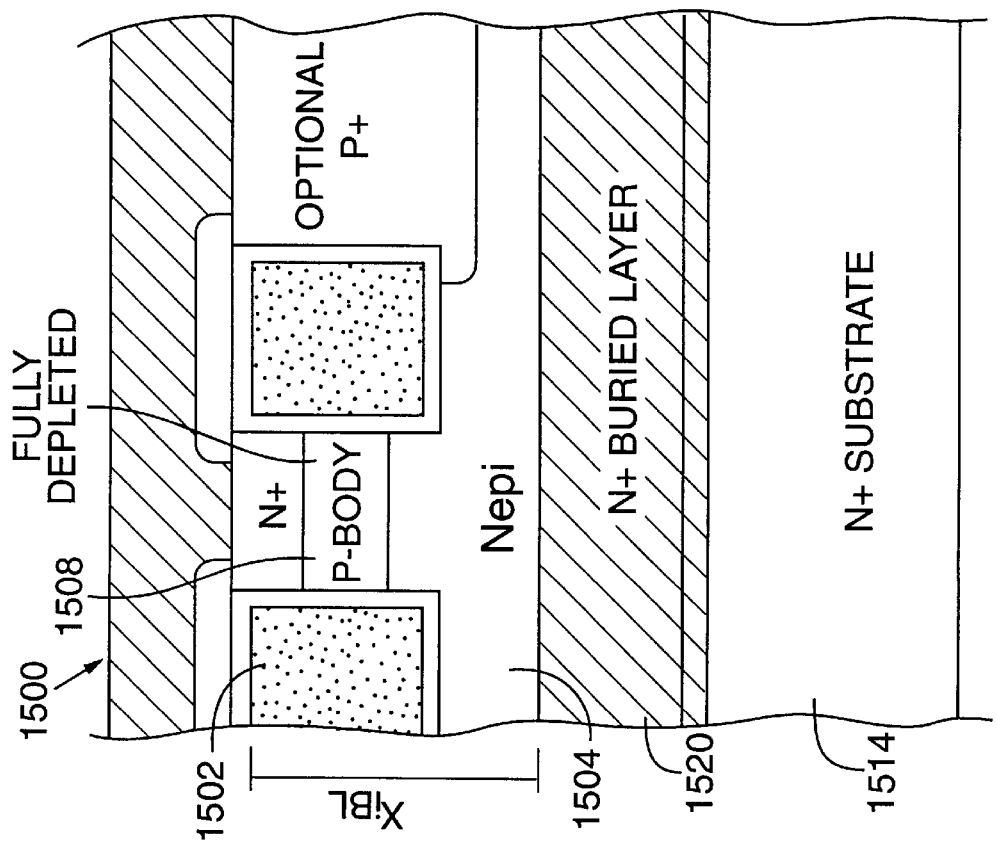
FIGS. 15A and 15B illustrate cross-sectional views of vertical trench-gated MOSFETs in accordance with the invention having closely spaced trenches and no body contacts.
Figure 15B:
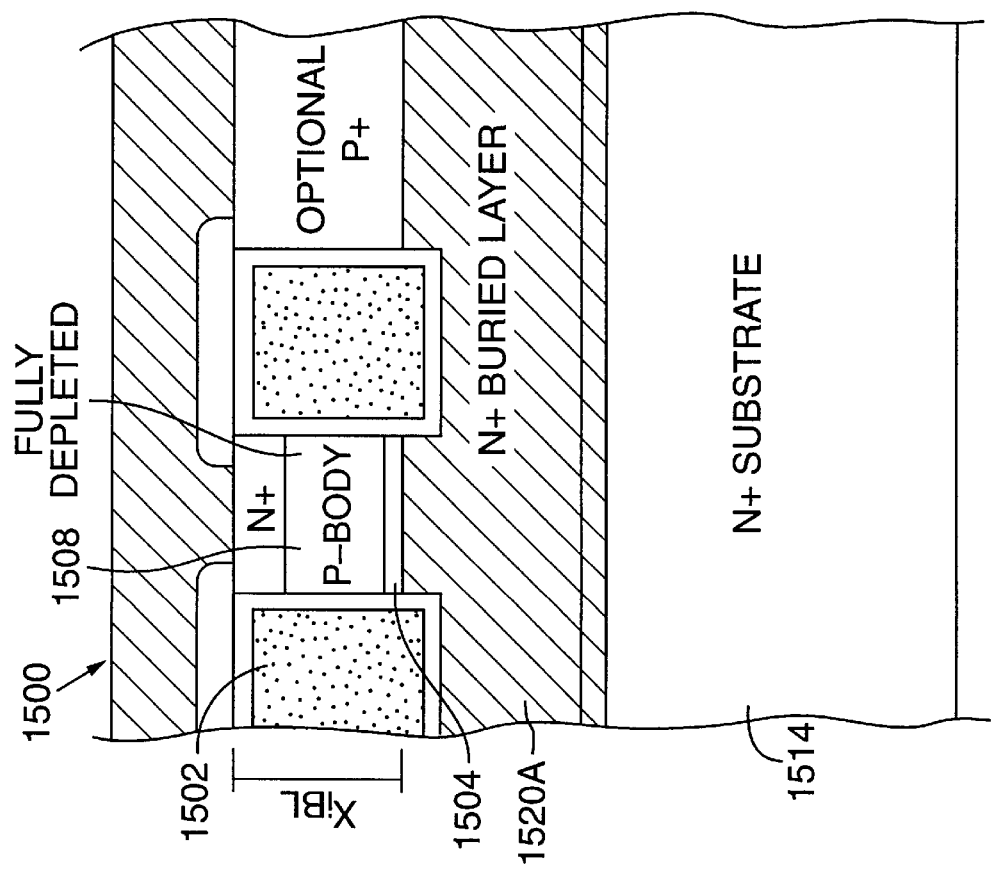

FIGS. 15A and 15B show a buried layer of this invention with a MOSFET 1500 in which there is no contact for P body region 1508. The distance between the gate trenches is small (e.g., 1.5 μm) and the gate 1502 consists of N-type polysilicon. As a result, P body region 1508 is fully depleted when the MOSFET is turned off. N+ buried layer 1520 extends into N+ substrate 1514, but the top edge of N+ buried layer 1520 is separated from the bottoms of the trenches.

FIG. 15B shows a similar device, except that the N+ buried layer 1520A extends to a level above the bottoms of the trenches.

Figure 16A:
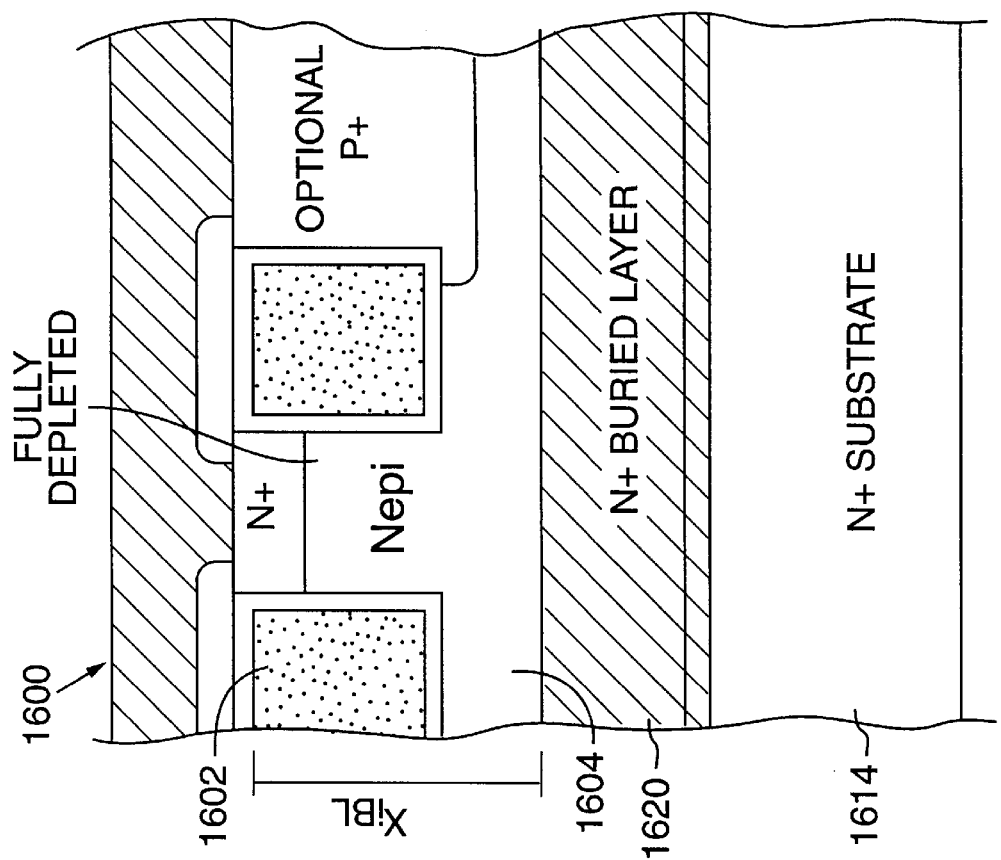
FIGS. 16A and 16B illustrate cross-sectional views of vertical accumulation mode trench-gated MOSFETs in accordance with the invention, having no body regions.
Figure 16B:
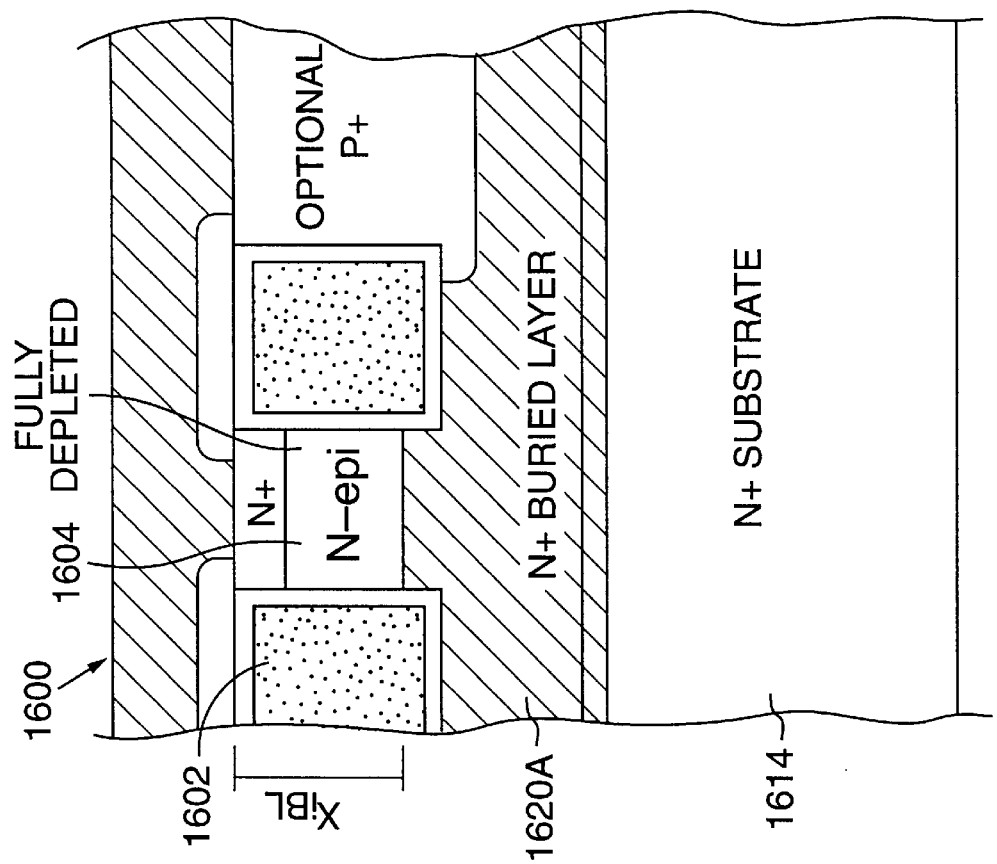

FIGS. 16A and 16B show cross-sectional views of an accumulation mode field effect transistor (ACCUFET), which has no body region. The trenches are spaced close together and the gate is doped with N-type material. As a result, the N-epi region 1604 between the trenched-gates is fully depleted with the device is turned off. In the embodiment shown in FIG. 16A, the N+ buried layer 1620 is separated from the bottoms of the trenches; in the embodiment shown in FIG. 16B, the N+ buried layer 1620A extends to a level above the bottoms of the trenches. In both embodiments, the N+ buried layer extends into N+ substrate 1614.

Figure 17A:
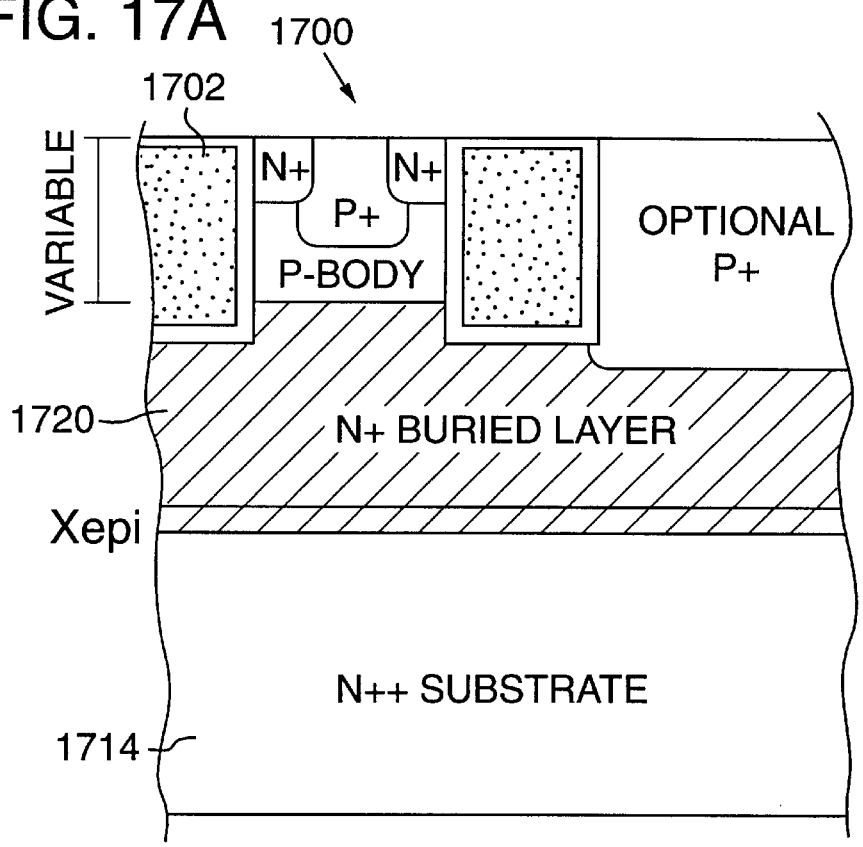
FIG. 17A shows a cross-sectional view of a vertical trench-gated MOSFET in which the buried layer is implanted before the epi layer is grown and extends to a level above the bottoms of the trenches.

MOSFET 1700 shown in FIG. 17A is somewhat similar to MOSFET 800 shown in FIG. 8, but the N+ buried layer 1720 is not implanted through the top surface of the epitaxial layer. Rather N+ buried layer 1720 is implanted into the top surface of N++ substrate 1714. The epitaxial layer is then grown on the N++ substrate 1714. During this and subsequent processing steps N+ buried layer 1720 diffuses upward into the epitaxial layer. Thus the distance between the top edge of N+ buried layer 1720 and the surface of the epitaxial layer varies with the thickness of the epitaxial layer. However, the dopant concentration in N+ buried layer 1720 is controlled to be lower than the dopant concentration in N++ substrate 1714. N+ buried layer 1720 therefore has fewer crystallographic problems than the N++ substrate 1714. While a similar process sequence can be used for the planar DMOS, the benefits are reduced since the gate oxide is not formed in the N+ substrate.

Figure 17B:
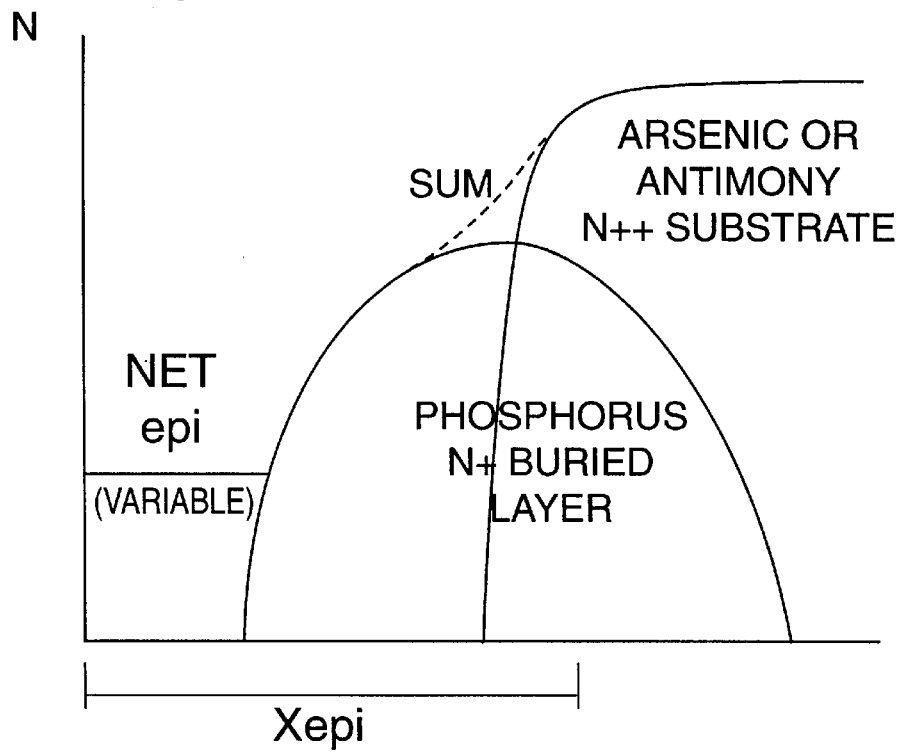
FIG. 17B shows a graph of the dopant concentration as a function of depth for the MOSFET shown in FIG. 17A.

FIG. 17B shows a graph of the dopant concentration versus the depth below the surface of the epitaxial layer. The thickness of the epitaxial layer is shown as $X_{epi}$ and the distance between the surface of the epitaxial layer and the top edge of the buried layer is shown as "Net epi", which is variable. The structure exemplified by MOSFET 1700 allows one to dope the substrate very heavily while allowing the trenches to extend into the buried layer. Since the dopant concentration and consequently the extent of crystallographic defects in the buried layer are controlled, the integrity of the gate oxide can be maintained while providing a low resistance path from the drain end of the channel to the lower surface of the substrate. The trenches are preferably etched deep enough that they are certain to extend into the N+ buried layer, even taking into account variations in the thickness of the epitaxial layer.

N+ buried layer 1720 might have a resistivity that exceeds the resistivity of N++ substrate 1714 by a factor of ten. For example, the resistivity of N+ buried layer 1720 could be on the order of 0.01 Ω-cm as compared with 0.001 Ω-cm for N++ substrate 1714. To insure that N+ buried layer 1720 diffuses upward more rapidly than the substrate, a relatively slow-diffusing dopant (such as As or Sb) is used to dope the substrate, and a relatively fast-diffusing dopant (such as P) is used to form the N+ buried layer. For a P-channel device, the substrate could be doped with B and the buried layer could be formed with Al or In. The Al or In buried layer would diffuse upward faster than the B substrate.

The embodiments described above are intended to be illustrative only and not limited the broad principles of this invention. Numerous alternative embodiments that are within the principles of this invention will be apparent to those skilled in the art. For example, while the embodiments described above generally refer to N-channel devices, the principles of this invention are also applicable to P-channel devices. The following claims are intended to cover all such embodiments.

I claim:

1. A vertical trench-gated power MOSFET comprising:
   a semiconductor substrate of a first conductivity type;
   an epitaxial layer formed on said substrate;
   a gate formed in a trench extending downward from a surface of said epitaxial layer;
   a source region of said first conductivity type formed in said epitaxial layer adjacent said surface thereof;
   a body region of a second conductivity type opposite to said first conductivity type formed in said epitaxial layer adjacent said source region and a wall of said trench, said source and body regions being formed in a cell of said MOSFET bordered on at least two sides by said trench;
   a drain which comprises said substrate and a portion of said epitaxial layer located adjacent said body region, said portion of said epitaxial layer being doped with ions of said first conductivity type to a first concentration level; and
   a buried layer formed within said epitaxial layer and extending continuously across said cell, said buried layer having an upper edge that is located at a level above an interface between said substrate and said epitaxial layer and a lower edge that is located at a level below said interface, a portion of said buried layer within said epitaxial layer being doped with ions of said first conductivity type to a second concentration level which is greater than said first concentration level.

2. The power MOSFET of claim 1 wherein the upper edge of said buried layer is located at a level below a bottom of said trench.

3. The power MOSFET of claim 2 further comprising a diffusion of said second conductivity type extending downward from said surface of said epitaxial layer outside of an active MOSFET cell of said power MOSFET.

4. The power MOSFET of claim 2 further comprising a diffusion of said second conductivity type extending downward from said body region in a central region of an active MOSFET cell of said power MOSFET.

5. The power MOSFET of claim 2 further comprising a plug region within said epitaxial layer adjoining an upper edge of said buried layer, said plug region being located beneath said body region in a central area of an active MOSFET cell of said power MOSFET and being doped with ions of said first conductivity type to a third concentration level which is greater than said first concentration level and which may be equal to said second concentration level.

6. The power MOSFET of claim 1 wherein the upper edge of said buried layer is located at a level above a bottom of said trench.

7. The power MOSFET of claim 1 wherein said buried layer does not extend into a edge termination area of said power MOSFET.

8. The power MOSFET of claim 1 further comprising a body contact region adjacent said surface of said epitaxial layer.

9. The power MOSFET of claim 8 further comprising a metal layer shorting said source region and said body contact region together.

10. The power MOSFET of claim 1 wherein said body region does not extend to a surface of said epitaxial layer within an active MOSFET cell.

11. The power MOSFET of claim 10 wherein said body region within said active MOSFET cell is substantially fully depleted of charge carriers when said gate is biased so as to turn said power MOSFET off.

12. The power MOSFET of claim 1, wherein the upper edge of said buried layer is located at a level below a bottom of said trench.

13. The power MOSFET of claim 1, wherein the upper edge of said buried layer is located at a level above a bottom of said trench.

14. A process of fabricating a MOSFET comprising the steps of:

forming an epitaxial layer on a surface of a semiconductor substrate, said epitaxial layer having a substantially planar top surface, both of said substrate and said epitaxial layer being doped with ions of a first conductivity type, said substrate being doped to a greater concentration level than said epitaxial layer;

implanting ions of said first conductivity type through said top surface of said epitaxial layer so as to form a buried layer of said first conductivity type;

forming a trench extending downward from said surface of said epitaxial layer;

forming a dielectric layer on a wall of said trench;

filling said trench with a conductive gate material, said gate material being electrically insulated from said epitaxial layer by said dielectric layer;

forming a body region of a second conductivity type opposite to said first conductivity type in said epitaxial layer; and forming a source region of said first conductivity type in said epitaxial layer;

wherein at the completion of said process an upper edge of said buried layer is at a level that is located above an interface between said substrate and said epitaxial layer and a lower edge of said buried layer is at a level that is located below said interface.

15. The process of claim 14 wherein said buried layer is formed before said trench is formed.

16. The process of claim 14 wherein said buried layer is formed after said body region is formed but before said source region is formed.

17. The process of claim 14 wherein said buried layer is formed after said source region is formed.

18. The process of claim 14 comprising the further step of forming a body contact region in said epitaxial layer, said buried layer being formed after the formation of said body contact.

19. The process of claim 14 comprising the further step of forming an oxide layer over said trench, said buried layer being formed after the formation of said oxide layer.

20. A process of fabricating a MOSFET comprising the steps of:

forming an epitaxial layer on a surface of a semiconductor substrate, said epitaxial layer having a substantially planar top surface, both of said substrate and said epitaxial layer being doped with ions of a first conductivity type, said substrate being doped to a greater concentration level than said epitaxial layer;

implanting ions of said first conductivity type through said top surface of said epitaxial layer so as to form a buried layer of said first conductivity type;

forming a dielectric layer on said surface of said epitaxial layer;

forming a gate over said dielectric layer;

forming a body region of a second conductivity type opposite to said first conductivity type in said epitaxial layer; and forming a source region of said first conductivity type in said epitaxial layer;

wherein at the completion of said process an upper edge of said buried layer is at a level that is located above an interface between said substrate and said epitaxial layer and a lower edge of said buried layer is at a level that is located below said interface.

21. The process of claim 20 wherein said buried layer is formed before said gate is formed.

22. A process of fabricating a MOSFET comprising the steps of:

providing a semiconductor substrate doped with ions of first conductivity type;

implanting ions of said first conductivity type into said substrate so as to form a layer of said first conductivity type within said substrate;

forming an epitaxial layer on a surface of said semiconductor substrate, said epitaxial layer being doped with ions of said first conductivity type;

allowing ions within said layer of said first conductivity type to diffuse across an interface between said substrate and said epitaxial layer;

forming a trench extending downward from said surface of said epitaxial layer;

forming a dielectric layer on a wall of said trench;

filling said trench with a conductive gate material, said gate material being electrically insulated from said epitaxial layer by said dielectric layer;

forming a body region of a second conductivity type opposite to said first conductivity type in said epitaxial layer; and forming a source region of said first conductivity type in said epitaxial layer;

wherein at the completion of said process said layer of ions of said first conductivity type extends across an interface between said substrate and said epitaxial layer downward to a level below said interface and upward to a level above a bottom of said trench.

23. The process of claim 14 further comprising the step of heating said substrate and said epitaxial layer thereby to diffuse said ions of said first conductivity type in said buried layer and increase the thickness of said buried layer.

24. The process of claim 20 further comprising the step of heating said substrate and said epitaxial layer thereby to diffuse said ions of said first conductivity type in said buried layer and increase the thickness of said buried layer.

25. The process of claim 22 further comprising the step of heating said substrate and said epitaxial layer thereby to diffuse said ions in said layer of said first conductivity type and increase the thickness of said layer of said first conductivity type.

* * * * *